US012526973B2

(12) United States Patent
Lee et al.

(10) Patent No.: US 12,526,973 B2

(45) Date of Patent: Jan. 13, 2026

(54) SEMICONDUCTOR MEMORY DEVICE

(71) Applicant: Samsung Electronics Co., Ltd., Suwon-si (KR)

(72) Inventors: Jongmoo Lee, Suwon-si (KR); Julpin Park, Suwon-si (KR); Jihoon Chang, Suwon-si (KR); Dongsik Park, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 434 days.

(21) Appl. No.: 18/143,314

(22) Filed: May 4, 2023

(65) Prior Publication Data

US 2024/0074139 A1 Feb. 29, 2024

(30) Foreign Application Priority Data

Aug. 31, 2022 (KR) ........................ 10-2022-0110327

(51) Int. Cl.

*H10B 12/00* (2023.01)
*H10D 30/63* (2025.01)

(52) U.S. Cl.

CPC ......... *H10B 12/033* (2023.02); *H10B 12/315* (2023.02); *H10D 30/63* (2025.01)

(58) Field of Classification Search

CPC ................ H10B 12/033; H10B 12/315; H10B 12/485; H10B 12/05; H10B 12/30; H10B 12/0335; H10D 30/63; H10D 30/6728; H10D 30/6755; H10D 1/716; H10D 84/0149; H10D 84/016; H10D 88/01; H10D 84/038; H10D 88/00; H10D 1/68

See application file for complete search history.

(56) References Cited

U.S. PATENT DOCUMENTS

| | | | |
|---|---|---|---|
| 6,727,141 | B1 | 4/2004 | Bronner et al. |
| 8,524,560 | B2 | 9/2013 | Kim et al. |
| 8,742,493 | B2 | 6/2014 | Kim et al. |
| 8,866,219 | B2 | 10/2014 | Kim |
| 9,111,960 | B2 | 8/2015 | Kim et al. |

(Continued)

FOREIGN PATENT DOCUMENTS

TW 201334185 A1 8/2013

OTHER PUBLICATIONS

Office Action issued on Aug. 15, 2025 by the Taiwanese Patent Office in corresponding TW Patent Application No. 112127865.

(Continued)

*Primary Examiner* — David Vu

(74) *Attorney, Agent, or Firm* — Sughrue Mion, PLLC

(57) ABSTRACT

A semiconductor memory device including a substrate, a plurality of conductive lines extending in a first horizontal direction on the substrate and spaced apart from each other in a second horizontal direction perpendicular to the first horizontal direction, a first cell stack on each of the plurality of conductive lines and including a plurality of first vertical transistor structures and a plurality of first connection contacts, a second cell stack on the first cell stack and including a plurality of second vertical transistor structures and a plurality of second connection contacts, and a plurality of capacitor structures arranged on the second cell stack and connected to the plurality of first vertical transistor structures and the plurality of second vertical transistor structures.

20 Claims, 40 Drawing Sheets

(56) References Cited

U.S. PATENT DOCUMENTS

| | | | |
|---|---|---|---|
| 9,159,618 B2 | 10/2015 | Hijioka et al. | |
| 10,211,364 B2 | 2/2019 | Schuele et al. | |
| 10,916,317 B2 | 2/2021 | Chung | |
| 11,094,697 B2 | 8/2021 | Yang et al. | |
| 11,217,588 B2 | 1/2022 | Sukekawa et al. | |
| 2013/0221356 A1* | 8/2013 | Yamazaki | H10D 87/00 257/296 |
| 2019/0206736 A1 | 7/2019 | Sills et al. | |
| 2021/0296314 A1 | 9/2021 | Kang et al. | |
| 2022/0037326 A1 | 2/2022 | Han | |
| 2022/0122980 A1 | 4/2022 | Han et al. | |
| 2022/0139443 A1 | 5/2022 | Kim et al. | |
| 2022/0223732 A1 | 7/2022 | Ryu et al. | |

OTHER PUBLICATIONS

Communication dated Jan. 19, 2024, issued by European Patent Office in European Patent Application No. 23186774.8.

* cited by examiner

SEMICONDUCTOR MEMORY DEVICE

CROSS-REFERENCE TO RELATED APPLICATION

This application claims priority to Korean Patent Application No. 10-2022-0110327, filed on Aug. 31, 2022, in the Korean Intellectual Property Office, the disclosure of which is incorporated by reference herein in its entirety.

BACKGROUND

The disclosure relates to a semiconductor memory device, and more particularly, to a semiconductor memory device including a vertical channel transistor.

As semiconductor memory devices have increasingly become highly integrated, semiconductor devices included in the semiconductor memory devices are becoming highly integrated. Accordingly, to achieve high integration of semiconductor devices, vertical channel transistors that are formed vertically on semiconductor substrates, instead of planar channel transistors that are formed planarly on semiconductor substrates, have been introduced.

SUMMARY

One or more example embodiment provides a semiconductor memory device including a highly integrated vertical channel transistor.

According to an aspect of an example embodiment, a semiconductor memory device includes: a substrate; a plurality of conductive lines extending in a first horizontal direction on the substrate and spaced apart from each other in a second horizontal direction perpendicular to the first horizontal direction; a first cell stack on each of the plurality of conductive lines and comprising a plurality of first vertical transistor structures and a plurality of first connection contacts; a second cell stack on the first cell stack and comprising a plurality of second vertical transistor structures and a plurality of second connection contacts; and a plurality of capacitor structures on the second cell stack and connected to the plurality of first vertical transistor structures and the plurality of second vertical transistor structures, wherein each of the plurality of first connection contacts is adjacent to one of the plurality of first vertical transistor structures and under one of the plurality of second vertical transistor structures, and electrically connects one of the plurality of conductive lines to one of the plurality of second vertical transistor structures, and wherein each of the plurality of second connection contacts is adjacent to one of the plurality of second vertical transistor structures and on one of the plurality of first vertical transistor structures, and electrically connects one of the plurality of first vertical transistor structures to one of the plurality of capacitor structures.

According to an aspect of an example embodiment, a semiconductor memory device includes: a substrate; a conductive line extending in a horizontal direction on the substrate; a first cell stack on the conductive line and comprising a first vertical transistor structure and a first connection contact; a second cell stack on the first cell stack and comprising a second vertical transistor structure and a second connection contact; and a plurality of capacitor structures arranged on the second cell stack, wherein the first vertical transistor structure and the second connection contact are arranged in a vertical direction between the conductive line and one of the plurality of capacitor structures and are connected to each other in series, and wherein the first connection contact and the second vertical transistor structure are arranged in the vertical direction between the conductive line and another one of the plurality of capacitor structures and are connected to each other in series.

According to an aspect of an example embodiment, a semiconductor memory device includes a conductive line disposed on a substrate and extending in a horizontal direction; a first cell stack on the conductive line and comprising a first vertical transistor structure, a first interlayer insulating layer surrounding the first vertical transistor structure, and a first connection contact adjacent to the first vertical transistor structure and passing through the first interlayer insulating layer, the first vertical transistor structure comprising a first channel layer having at least a portion extending in a vertical direction, a first gate electrode, and a first gate dielectric layer between the first channel layer and the first gate electrode; a second cell stack on the first cell stack and comprising a second vertical transistor structure, a second interlayer insulating layer surrounding the second vertical transistor structure, and a second connection contact adjacent to the second vertical transistor structure and passing through the second interlayer insulating layer, the second vertical transistor structure comprising a second channel layer having at least a portion extending in the vertical direction, a second gate electrode, and a second gate dielectric layer between the second channel layer and the second gate electrode; and a plurality of capacitor structures on the second cell stack and comprising a plurality of lower electrodes electrically connected to the first channel layer and the second channel layer, an upper electrode, and a capacitor dielectric layer between the plurality of lower electrodes and the upper electrode, wherein the first vertical transistor structure and the second connection contact are arranged in the vertical direction between the conductive line and one of the plurality of lower electrodes and are connected to each other in series, wherein the first connection contact and the second vertical transistor structure are arranged in the vertical direction between the conductive line and another one of the plurality of lower electrodes and are connected to each other in series, and wherein the first channel layer and the second channel layer are disposed not to overlap each other in the vertical direction.

BRIEF DESCRIPTION OF DRAWINGS

The above and other aspects and features will be more apparent from the following description of example embodiments, taken in conjunction with the accompanying drawings, in which.

DETAILED DESCRIPTION OF EMBODIMENTS

Example embodiments will be described more fully with reference to the accompanying drawings, in which example embodiments are shown. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1A:
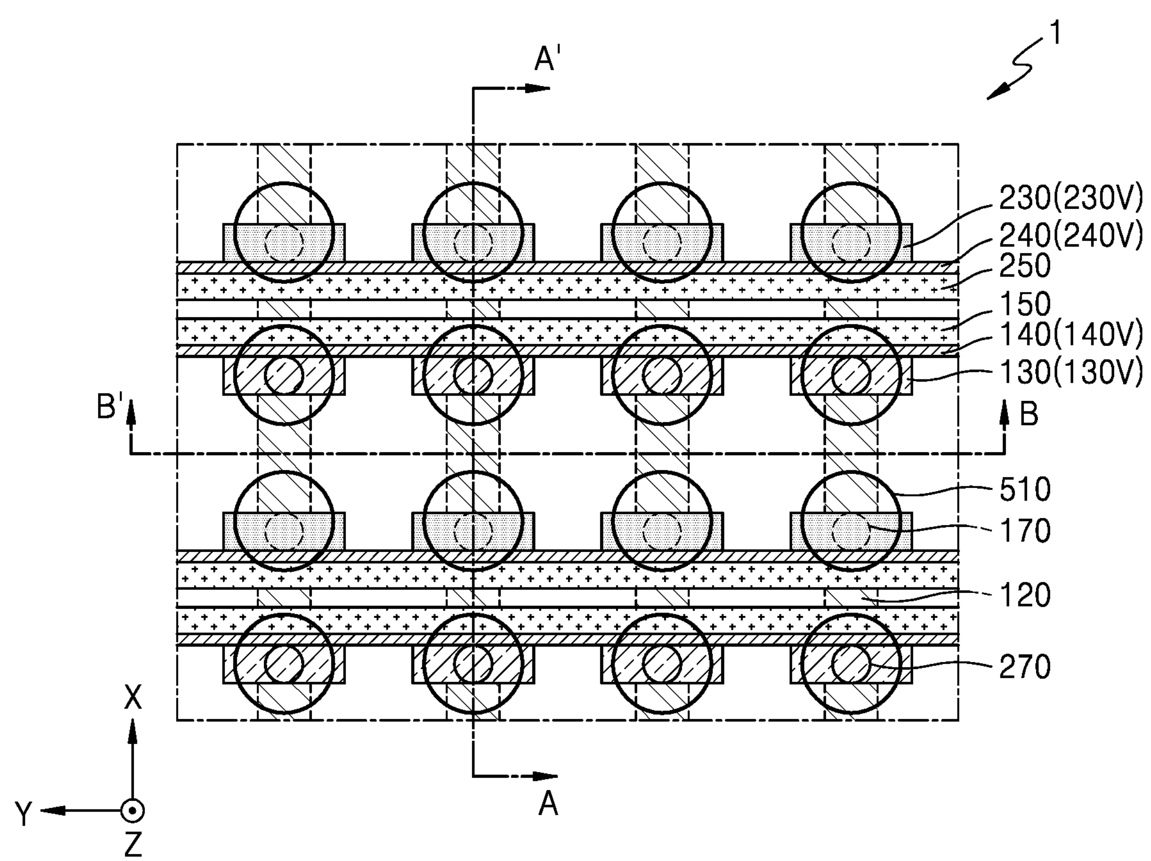
FIGS. 1A and 1B are a plan view and a cross-sectional view illustrating a semiconductor memory device according to embodiments.
Figure 1B:
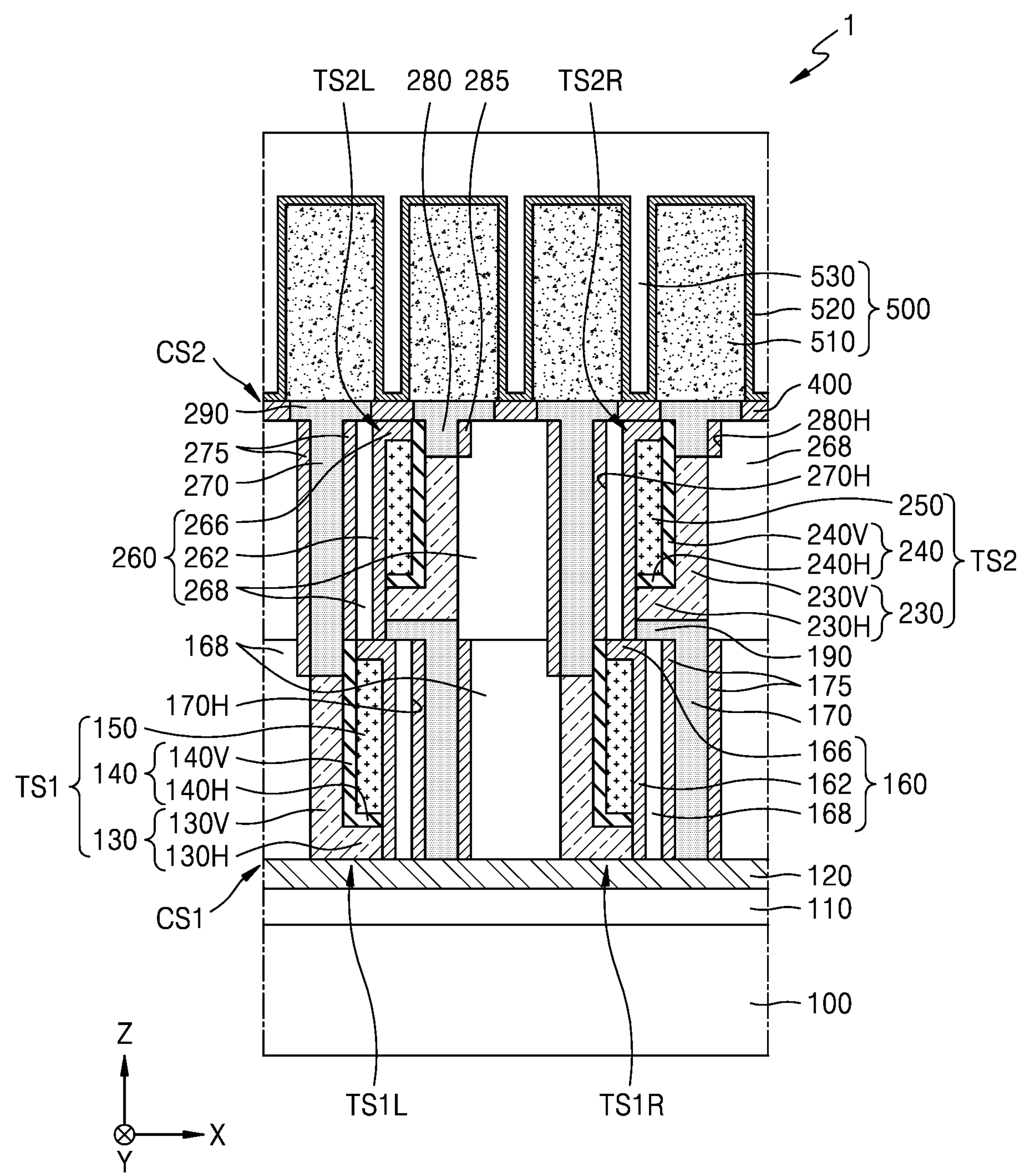

FIGS. 1A and 1B are a plan view and a cross-sectional view illustrating a semiconductor memory device 1 according to embodiments. In detail, FIG. 1B is a cross-sectional view taken along a line A-A' of FIG. TA.

Referring to FIGS. 1A and 1B together, the semiconductor memory device 1 according to example embodiments may include a substrate 100, an interline insulating layer 110, a plurality of conductive lines 120 on the interline insulating layer 110, a first cell stack CS1 on the interline insulating layer 110 and the conductive line 120, a second cell stack CS2 on the first cell stack CST, and a plurality of capacitor structures 500 on the second cell stack CS2. The plurality of capacitor structures 500 may include a plurality of lower electrodes 510, a capacitor dielectric layer 520, and an upper electrode 530.

The substrate 100 may include a semiconductor material, such as a Group IV semiconductor material, a Group III-V semiconductor material, or a Group II-VI semiconductor material. The Group IV semiconductor material may include, for example, silicon (Si), germanium (Ge), or silicon-germanium (Si—Ge). The Group III-V semiconductor material may include, for example, gallium arsenide (GaAs), indium phosphide (InP), gallium phosphide (GaP), indium arsenide (InAs), indium antimonide (InSb), or indium gallium arsenide (InGaAs). The Group II-VI semiconductor material may include, for example, zinc telluride (ZnTe) or cadmium sulfide (CdS). The substrate 100 may be, for example, a bulk wafer or an epitaxial layer. The substrate 100 may have a structure in which a base substrate and an epitaxial layer are stacked, but embodiments are not limited thereto. In some embodiments, logic cells constituting a core circuit, such as a sense amplifier, and electrically connected to the conductive line 120 may be arranged in the substrate 100.

The plurality of conductive lines 120 may be formed on the substrate 100. For example, the interline insulating layer 110 may be formed on the substrate 100, and the plurality of conductive lines 120 may be arranged on the interline insulating layer 110. The conductive line 120 may function as a bit line of the semiconductor memory device 1.

Referring to FIGS. TA, 1B, and 14B together, for example, the interline insulating layer 110 may be disposed on and cover lower and side surfaces of each of the plurality of conductive lines 120. The plurality of conductive lines 120 may each extend in a first horizontal direction (X direction). The plurality of conductive lines 120 may be apart from each other in a second horizontal direction (Y direction) perpendicular to the first horizontal direction (X direction), and may each extend in the first horizontal direction (X direction).

The interline insulating layer 110 may be formed on and on and to cover side surfaces of the plurality of conductive lines 120 and in and to fill a space between the plurality of conductive lines 120. The interline insulating layer 110 may be a single layer including one type of insulating material or a multi-layer including a combination of various types of insulating materials. For example, the interline insulating layer 110 may be configured as a multi-layer including a first interline insulating layer 110A and a second interline insulating layer 110B, the first interline insulating layer 110A disposed on and covering a lower surface of the conductive line 120 and located at a lower vertical level than the conductive line 120, and the second interline insulating layer 110B disposed on and covering a side surface of the conductive line 120 and located at a higher vertical level than the lower surface of the conductive line 120.

The conductive line 120 may include doped polysilicon, metal, conductive metal nitride, conductive metal silicide, conductive metal oxide, or a combination thereof. For example, the conductive line 120 may include doped polysilicon, Al, Cu, Ti, Ta, Ru, W, Mo, Pt, Ni, Co, TiN, TaN, WN, WSi, NbN, TiAl, TiAlN, TiSi, TiSiN, TaSi, TaSiN, RuTiN, NiSi, CoSi, IrOx, RuOx, or a combination thereof, but is not limited thereto. Alternatively, the conductive line 120 may include a two-dimensional (2D) semiconductor material. The 2D semiconductor material may include, for example, graphene, carbon nanotube, or a combination thereof. The conductive line 120 may include a single layer or multiple layers including the conductive materials described above.

Referring back to FIGS. 1A and 1B, the semiconductor memory device 1 may be a semiconductor memory device including a vertical channel transistor (VCT). The VCT may refer to a structure in which channel lengths of channel layers, for example, a first channel layer 130 and a second channel layer 230, extend in a vertical direction (Z direction) perpendicular to an upper surface of the substrate 100. Each of the first channel layer 130 and the second channel layer 230 may include a first source/drain region and a second source/drain region that are arranged in the vertical direction (Z direction). For example, lower portions of the first channel layer 130 and the second channel layer 230 may each function as the first source/drain region, and upper portions of the first channel layer 130 and the second channel layer 230 may each function as the second source/drain region. A portion of the first channel layer 130 between the first source/drain region and the second source/drain region and a portion of the second channel layer 230 between the first source/drain region and the second source/drain region may each function as a channel region.

The semiconductor memory device 1 may include a plurality of vertical transistor structures and a plurality of connection contacts. One of the plurality of vertical transistor structures and one of the plurality of capacitor structures 500 may together constitute a memory cell, and thus, the semiconductor memory device 1 may include a plurality of memory cells that are constituted by the plurality of vertical transistor structures and the plurality of capacitor structures 500. The plurality of vertical transistor structures and the plurality of connection contacts may be connected to each other in series between the conductive line 120 and the lower electrode 510. One or more of the plurality of vertical transistor structures and one or more of the plurality of connection contacts may be arranged in the vertical direction (Z direction) between the conductive line 120 and the lower electrode 510 such that at least portions thereof may overlap each other in the vertical direction (Z direction). A plurality of channel layers included in the plurality of vertical transistor structures may be arranged not to overlap each other in the vertical direction (Z direction). The plurality of vertical transistor structures may include a plurality of first vertical transistor structures TS1 and a plurality of second vertical transistor structures TS2. The plurality of connection contacts may include a plurality of first connection contacts 170 and a plurality of second connection contacts 270. For example, a plurality of first channel layers 130 and a plurality of second channel layers 230 may be arranged not to overlap each other in the vertical direction (Z direction).

The first cell stack CS1 may include the plurality of first vertical transistor structures TS1 and the plurality of first connection contacts 170, and the second cell stack CS2 may include the plurality of second vertical transistor structures TS2 and the plurality of second connection contacts 270. The first vertical transistor structure TS1 and the second connection contact 270, or the first connection contact 170 and the second vertical transistor structure TS2 may be between the conductive line 120 and the capacitor structure 500. Some of the plurality of capacitor structures 500 may each be connected to one of the plurality of conductive lines 120 through the first vertical transistor structure TS1 and the second connection contact 270, and some other ones of the plurality of capacitor structures 500 may each be connected to one of the plurality of conductive lines 120 through the first connection contact 170 and the second vertical transistor structure TS2.

The first vertical transistor structure TS1 may include the first channel layer 130, a first gate electrode 150, and a first gate dielectric layer 140 between the first channel layer 130 and the first gate electrode 150. The second vertical transistor structure TS2 may include the second channel layer 230, a second gate electrode 250, and a second gate dielectric layer 240 between the second channel layer 230 and the second gate electrode 250.

The first channel layer 130 may be arranged on the conductive line 120, and the second channel layer 230 may be arranged on the first connection contact 170. In some embodiments, the first channel layer 130 and the second channel layer 230 may include the same material.

In some embodiments, each of the first channel layer 130 and the second channel layer 230 may include a semiconductor material. For example, each of the first channel layer 130 and the second channel layer 230 may include polysilicon.

In some other embodiments, each of the first channel layer 130 and the second channel layer 230 may include an oxide semiconductor material. For example, each of the first channel layer 130 and the second channel layer 230 may include at least one of a binary or ternary oxide semiconductor material including a first metal element, a ternary oxide semiconductor material including a first metal element and a second metal element that are different from each other, and a quaternary oxide semiconductor material including a first metal element, a second metal element, and a third metal element that are different from each other.

The binary or ternary oxide semiconductor material may be, for example, one of zinc oxide (ZnO) ($Zn_xO$), gallium oxide (GaO) ($Ga_xO$), tin oxide (TiO) ($Ti_xO$), zinc oxynitride (ZnON) ($Zn_xO_yN$), indium zinc oxide (IZO) ($In_xZn_yO$), gallium zinc oxide (GZO) ($Ga_xZn_yO$), tin zinc oxide (TZO) ($Sn_xZn_yO$), and tin gallium oxide (TGO) ($Sn_xGa_yO$), but is not limited thereto. The quaternary oxide semiconductor material may be, for example, one of indium gallium zinc oxide (IGZO) ($In_xGa_yZn_zO$), indium gallium silicon oxide (IGSO) ($In_xGa_ySi_zO$), indium tin zinc oxide (ITZO) ($In_xSn_yZn_zO$), indium gallium tin oxide (IGTO) ($In_xGa_ySn_zO$), zirconium zinc tin oxide (ZZTO) ($Zr_xZn_ySn_zO$), hafnium indium zinc oxide (HIZO) ($Hf_xIn_yZn_zO$), gallium zinc tin oxide (GZTO) ($Ga_xZn_ySn_zO$), aluminum zinc tin oxide (AZTO) ($Al_xZn_ySn_zO$), ytterbium gallium zinc oxide (YGZO) ($Yb_xGa_yZn_zO$), and indium aluminum zinc oxide (IAZO), but embodiments are not limited thereto.

In some embodiments, each of the first channel layer 130 and the second channel layer 230 may include a crystalline oxide semiconductor material or an amorphous oxide semiconductor material. When each of the first channel layer 130 and the second channel layer 230 includes a crystalline oxide semiconductor material, each of the first channel layer 130 and the second channel layer 230 may have at least one of single crystallinity, polycrystallinity, spinel crystallinity, and c-axis aligned crystallinity (CAAC).

In some embodiments, each of the first channel layer 130 and the second channel layer 230 may be formed by stacking at least two layers including a first layer including a crystalline oxide semiconductor material and a second layer including an amorphous oxide semiconductor material. For example, each of the first channel layer 130 and the second channel layer 230 may be formed by sequentially stacking a first layer including a crystalline oxide semiconductor material, a second layer including an amorphous oxide semiconductor material, and a third layer including a crystalline oxide semiconductor material. For example, when the first channel layer 130 has a stacked structure including the first layer, the second layer, and the third layer, the first layer may be in contact with the conductive line 120, the third layer may be in contact with the second connection contact 270, and the second layer may be between the first layer and the third layer. For example, when the second channel layer 230 includes a stacked structure of the first layer, the second layer, and the third layer, the first layer may be in contact with the first connection contact 170, the third layer may be in contact with a third connection contact 280, and the second layer may be between the first layer and the third layer.

In some embodiments, the first channel layers 130 are spaced apart from each other and may be arranged on the conductive line 120. The first channel layers 130 that are spaced apart from each other may be arranged on each of the plurality of conductive lines 120 that are spaced apart from each other in the second horizontal direction (Y direction). Accordingly, the plurality of first channel layers 130 may be arranged apart from each other in a matrix form in the first horizontal direction (X direction) and the second horizontal direction (Y direction). Each of the plurality of first channel layers 130 may have an L-shaped vertical cross-section. For example, each of the plurality of first channel layers 130 may have an L-shape in a cross-section (X-Z plane) in the first horizontal direction (X direction) and the vertical direction (Z direction). Each of the plurality of first channel layers 130 may include a first horizontal portion 130H and a first vertical portion 130V, the first horizontal portion 130H extending in the first horizontal direction (X direction), and the first vertical portion 130V extending from the first horizontal portion 130H in the vertical direction (Z direction). For example, the first horizontal portion 130H of each of the plurality of first channel layers 130 may extend from the first vertical portion 130V in the first horizontal direction (X direction).

Herein, unless otherwise specified, a vertical cross-section refers to a vertical cross-section in an extension direction of the conductive line 120, that is, a vertical cross-section (X-Z plane) in the first horizontal direction (X direction).

The first gate dielectric layer 140 may be formed on the first channel layer 130. The first gate dielectric layer 140 may be between the first channel layer 130 and the first gate electrode 150. In some embodiments, an uppermost end of the first gate dielectric layer 140 may be at a higher vertical level than an uppermost end of the first gate electrode 150.

The first gate dielectric layer 140 may have an L-shaped vertical cross-section along an inner surface of one first channel layer 130 having an L-shaped vertical cross-section. In some embodiments, the uppermost end of the first gate dielectric layer 140 may extend in the vertical direction (Z direction) along an inner side surface of one first channel layer 130 having an L-shaped vertical cross-section, so as to be at a higher vertical level than an uppermost end of the first channel layer 130. The first gate dielectric layer 140 may include a first insulating horizontal portion 140H and a first insulating vertical portion 140V, the first insulating horizontal portion 140H extending in the first horizontal direction (X direction), and the first insulating vertical portion 140V extending from the first insulating horizontal portion 140H in the vertical direction (Z direction). For example, the first insulating horizontal portion 140H of the first gate dielectric layer 140 may extend from the first insulating vertical portion 140V in the first horizontal direction (X direction).

The first gate electrode 150 may be formed on the first gate dielectric layer 140. The first gate electrode 150 may extend in the vertical direction (Z direction) and be disposed on and cover the first gate dielectric layer 140. The first gate electrode 150 may extend long in the second horizontal direction (Y direction). The first gate electrode 150 may be disposed on and cover an inner surface of the first gate dielectric layer 140 having an L-shaped vertical cross-section, and may have an I-shaped vertical cross-section. For example, the first gate electrode 150 may be disposed on and cover the first insulating horizontal portion 140H of the first gate dielectric layer 140, and may extend in the vertical direction (Z direction) and be disposed on and cover the first insulating vertical portion 140V of the first gate dielectric layer 140.

The first cell stack CS1 may include a first interlayer insulating layer 160 surrounding the plurality of first vertical transistor structures TS1. The first interlayer insulating layer 160 may include a plurality of first vertical cover insulating layers 162, a plurality of first horizontal cover insulating layers 166, and a first filling insulating layer 168. The plurality of first vertical cover insulating layers 162 may be disposed on and cover one side surfaces of the plurality of first vertical transistor structures TS1, and the plurality of first horizontal cover insulating layers 166 may be disposed on and cover upper surfaces of a plurality of first gate electrodes 150 included in the plurality of first vertical transistor structures TS1.

The first vertical cover insulating layer 162 may be disposed on and cover one side surface of the first vertical transistor structure TS1 opposite to the first vertical portion 130V of the first channel layer 130. The first vertical cover insulating layer 162 may be disposed on and cover one side surface of the first gate electrode 150 opposite to the first vertical portion 130V. In some embodiments, the first vertical cover insulating layer 162 may extend toward the conductive line 120 and be disposed on and to cover one side surface of the first gate electrode 150 opposite to the first vertical portion 130V and be disposed on and cover one side surface of the first horizontal portion 130H of the first channel layer 130. For example, a lower surface of the first vertical cover insulating layer 162 may be in contact with an upper surface of the conductive line 120. The first horizontal cover insulating layer 166 may be connected to the first vertical cover insulating layer 162 and be disposed on and cover the upper surface of the first gate electrode 150.

In some embodiments, the first gate electrode 150 may be surrounded by the first gate dielectric layer 140, the first vertical cover insulating layer 162, and the first horizontal cover insulating layer 166. For example, an upper surface of the first gate electrode 150 adjacent to the first channel layer 130 may be covered by the first horizontal cover insulating layer 166, one side surface of the first gate electrode 150 may be covered by the first vertical cover insulating layer 162, a lower surface of the first gate electrode 150 may be covered by the first insulating horizontal portion 140H of the first gate dielectric layer 140, and the other side surface of the first gate electrode 150, that is, a side surface thereof facing the first vertical portion 130V of the first channel layer 130, may be covered by the first insulating vertical portion 140V of the first gate dielectric layer 140.

The first filling insulating layer 168 may surround the first vertical transistor structure TS1. In some embodiments, the first vertical cover insulating layer 162 may be between one side surface of the first horizontal portion 130H of the first channel layer 130, that is, one side surface of the first vertical transistor structure TS1, and the first filling insulating layer 168 on and to cover one side surface of the first gate electrode 150 opposite to the first vertical portion 130V of the first channel layer 130. In some embodiments, the first filling insulating layer 168 may be disposed on and cover the other side surface of the first vertical portion 130V of the first channel layer 130, that is, the other side surface of the first vertical transistor structure TS1, opposite to the first gate electrode 150. In some other embodiments, the first vertical cover insulating layer 162 and the first filling insulating layer 168 may sequentially cover the other side surface of the first vertical transistor structure TS1.

The plurality of first connection contacts 170 may pass through the first interlayer insulating layer 160 such that lower surfaces thereof may be connected to the conductive line 120. For example, the plurality of first connection contacts 170 may fill portions of a plurality of first contact holes 170H passing through the first filling insulating layer 168. A plurality of first side surface insulating layers 175 may be disposed on and cover inner side surfaces of the plurality of first contact holes 170H. The plurality of first side surface insulating layers 175 may be disposed on and cover the first filling insulating layer 168 exposed on the inner side surfaces of the plurality of first contact holes 170H. Each of the plurality of first side surface insulating layers 175 may have a hollow cylindrical shape, and each of the plurality of first connection contacts 170 may fill the cylindrical shape of each of the plurality of first side surface insulating layers 175. The plurality of first side surface insulating layers 175 may be between the plurality of first connection contacts 170 and the first interlayer insulating layer 160. For example, the plurality of first side surface insulating layers 175 may be between the plurality of first connection contacts 170 and the first filling insulating layer 168.

The plurality of first connection contacts 170 may be arranged adjacent to the plurality of first vertical transistor structures TS1. Each of the plurality of first connection contacts 170 may be arranged adjacent to one side surface of each of the plurality of first vertical transistor structures TS1 corresponding thereto. For example, each of the plurality of first connection contacts 170 may be arranged adjacent to the first horizontal portion 130H and the first insulating horizontal portion 140H, rather than the first vertical portion 130V and the first insulating vertical portion 140V, included in each of the plurality of first vertical transistor structures TS1 corresponding thereto. Each of the plurality of first connection contacts 170 may be arranged adjacent to each of the plurality of first vertical transistor structures TS1 corresponding thereto in the first horizontal direction (X direction). The first vertical transistor structure TS1 and the first connection contact 170 may be alternately arranged on one conductive line 120 in the first horizontal direction (X direction). That is, a first vertical transistor structure TS1 is disposed on the conductive line 120, then, moving in a horizontal direction, a first connection contact 170, then another first vertical transistor structure TS1, then another first connection contact 170, and so on.

Among the plurality of first vertical transistor structures TS1, a pair of first vertical transistor structures TS1 adjacent to each other in the first horizontal direction (X direction) may be referred to as a first left vertical transistor structure TS1L and a first right vertical transistor structure TS1R, respectively. The first channel layer 130 and the first gate dielectric layer 140 included in each of the first left vertical transistor structure TS1L and the first right vertical transistor structure TS1R may each have an L-shaped vertical cross-section. The first connection contact 170 corresponding to each of the first left vertical transistor structure TS1L and the first right vertical transistor structure TS1R may be arranged adjacent to each of the first left vertical transistor structure TS1L and the first right vertical transistor structure TS1R in the first horizontal direction (X direction).

A plurality of first connection pads 190 may be arranged respectively on the plurality of first connection contacts 170. The plurality of first connection contacts 170 may electrically connect the plurality of first connection pads 190 and the plurality of conductive lines 120 to each other. In some embodiments, the plurality of first connection pads 190 may be at a higher vertical level than a plurality of first gate dielectric layers 140. For example, upper surfaces of the plurality of first connection pads 190 may be at a higher vertical level than upper surfaces of the plurality of first gate dielectric layers 140. In some embodiments, lower surfaces of the plurality of first connection pads 190 may be at the same vertical level as an upper surface of the first filling insulating layer 168.

In some embodiments, the upper surfaces of the plurality of first gate dielectric layers 140, upper surfaces of the plurality of first horizontal cover insulating layers 166, the upper surface of the first filling insulating layer 168, and upper surfaces of the plurality of first side surface insulating layers 175 may be coplanar with each other. For example, the lower surfaces of the plurality of first connection pads 190 may be at the same vertical level as the upper surfaces of the plurality of first gate dielectric layers 140, the upper surfaces of the plurality of first horizontal cover insulating layers 166, the upper surface of the first filling insulating layer 168, and the upper surfaces of the plurality of first side surface insulating layers 175.

The plurality of second channel layers 230 may be arranged on the plurality of first connection pads 190. The plurality of second channel layers 230 may be arranged apart from each other in a matrix form in the first horizontal direction (X direction) and the second horizontal direction (Y direction). Each of the plurality of second channel layers 230 may have an L-shaped vertical cross-section. For example, each of the plurality of second channel layers 230 may have an L-shape in a cross-section (Y-Z plane) in the first horizontal direction (X direction) and the vertical direction (Z direction). Each of the plurality of second channel layers 230 may include a second horizontal portion 230H and a second vertical portion 230V, the second horizontal portion 230H extending in the first horizontal direction (X direction), that is, a right direction in FIG. 1B, and the second vertical portion 230V extending from the second horizontal portion 230H in the vertical direction (Z direction). For example, the second horizontal portion 230H of each of the plurality of second channel layers 230 may extend from the second vertical portion 230V in a direction opposite to the first horizontal direction (X direction), that is, a left direction (−X direction) in FIG. 1B.

The plurality of first vertical transistor structures TS1 and the plurality of second vertical transistor structures TS2 may have substantially mirror-symmetric vertical cross-sections in the first horizontal direction (X direction) with respect to the vertical direction (Z direction).

The second channel layer 230 and the first channel layer 130 may have substantially mirror-symmetric vertical cross-sections in the first horizontal direction (X direction) with respect to the vertical direction (Z direction). For example, the first channel layer 130 may have an L-shaped vertical cross-section, and the second channel layer 230 may have an inverted L-shaped vertical cross-section.

Herein, an L-shaped vertical cross-section refers to a vertical cross-section in which a horizontal portion extends from a vertical portion in a first direction (X direction), for example, the right direction in FIG. 1B, and an inverted L-shaped vertical section refers to a vertical section in which a horizontal portion extends from a vertical portion in a direction opposite to the first direction (X direction), for example, the left direction in FIG. 1B.

The second gate dielectric layer 240 may be formed on the second channel layer 230. The second gate dielectric layer 240 may be between the second channel layer 230 and the second gate electrode 250. In some embodiments, an uppermost end of the second gate dielectric layer 240 may be at a higher vertical level than an uppermost end of the second gate electrode 250.

The second gate dielectric layer 240 may have an inverted L-shaped vertical cross-section along an inner surface of one second channel layer 230 having an inverted L-shaped vertical cross-section. In some embodiments, the uppermost end of the second gate dielectric layer 240 may extend in the vertical direction (Z direction) along an inner side surface of one second channel layer 230 having an inverted L-shaped vertical cross-section, so as to be at a higher vertical level than an uppermost end of the second channel layer 230. The second gate dielectric layer 240 may include a second insulating horizontal portion 240H and a second insulating vertical portion 240V, the second insulating horizontal portion 240H extending in the first horizontal direction (X direction), and the second insulating vertical portion 240V extending from the second insulating horizontal portion 240H in the vertical direction (Z direction). For example, the second insulating horizontal portion 240H of the second gate dielectric layer 240 may extend from the second insulating vertical portion 240V in the direction opposite to the first horizontal direction (X direction).

Each of the first gate dielectric layer 140 and the second gate dielectric layer 240 may include, for example, at least one of silicon oxide, silicon oxynitride, silicon nitride, and a high-k material having a greater dielectric constant than silicon oxide, but is not limited thereto.

The second gate electrode 250 may be formed on the second gate dielectric layer 240. The second gate electrode 250 may extend in the vertical direction (Z direction) on and to cover the second gate dielectric layer 240. The second gate electrode 250 may extend long in the second horizontal direction (Y direction). The second gate electrode 250 may be disposed on and cover an inner surface of the second gate dielectric layer 240 having an inverted L-shaped vertical cross-section, and may have an I-shaped vertical cross-section. For example, the second gate electrode 250 may be disposed on and cover the second insulating horizontal portion 240H of the second gate dielectric layer 240, and may extend in the vertical direction (Z direction) on and to cover the second insulating vertical portion 240V of the second gate dielectric layer 240.

Each of the first gate electrode 150 and the second gate electrode 250 may include doped polysilicon, metal, conductive metal nitride, conductive metal silicide, conductive metal oxide, or a combination thereof. For example, each of the first gate electrode 150 and the second gate electrode 250 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto.

The second cell stack CS2 may include a second interlayer insulating layer 260 surrounding the plurality of second vertical transistor structures TS2. The second interlayer insulating layer 260 may include a plurality of second vertical cover insulating layers 262, a plurality of second horizontal cover insulating layers 266, and a second filling insulating layer 268. The plurality of second vertical cover insulating layers 262 may be disposed on and cover one side surfaces of the plurality of second vertical transistor structures TS2, and the plurality of second horizontal cover insulating layers 266 may be disposed on and cover upper surfaces of a plurality of second gate electrodes 250 included in the plurality of second vertical transistor structures TS2.

The second vertical cover insulating layer 262 may be disposed on and cover one side surface of the second vertical transistor structure TS2 opposite to the second vertical portion 230V of the second channel layer 230. For example, the second vertical cover insulating layer 262 may be disposed on and cover one side surface of the second gate electrode 250 opposite to the second vertical portion 230V. The second horizontal cover insulating layer 266 may be connected to the second vertical cover insulating layer 262 and cover the upper surface of the second gate electrode 250. In some embodiments, the second vertical cover insulating layer 262 may extend toward the first cell stack CS1 on and to cover one side surface of the second gate electrode 250 opposite to the second vertical portion 230V and on and to cover one side surface of the second horizontal portion 230H of the second channel layer 230. For example, a lower surface of the second vertical cover insulating layer 262 may be in contact with an upper surface of the first interlayer insulating layer 160. In FIG. 1, the lower surface of the second vertical cover insulating layer 262 is in contact with the upper surface of the first horizontal cover insulating layer 166. However, this is just an example, and embodiments are not limited thereto. In some embodiments, the lower surface of the second vertical cover insulating layer 262 may be in contact with the upper surface of the first filling insulating layer 168.

In some embodiments, the second gate electrode 250 may be surrounded by the second gate dielectric layer 240, the second vertical cover insulating layer 262, and the second horizontal cover insulating layer 266. For example, an upper surface of a portion of the second gate electrode 250 adjacent to the second channel layer 230 may be covered by the second horizontal cover insulating layer 266, one side surface of the second gate electrode 250 may be covered by the second vertical cover insulating layer 262, a lower surface of the second gate electrode 250 may be covered by the second insulating horizontal portion 240H of the second gate dielectric layer 240, and the other side surface of the second gate electrode 250, that is, a side surface thereof facing the second vertical portion 230V of the second channel layer 230, may be covered by the second insulating vertical portion 240V of the second gate dielectric layer 240.

The second filling insulating layer 268 may surround the second vertical transistor structure TS2. In some embodiments, the second vertical cover insulating layer 262 may be between one side surface of the second horizontal portion 230H of the second channel layer 230, that is, one side surface of the second vertical transistor structure TS2, and the second filling insulating layer 268 on and to cover one side surface of the second gate electrode 250 opposite to the second vertical portion 230V of the second channel layer 230. In some embodiments, the second filling insulating layer 268 may be disposed on and cover the other side surface of the second vertical portion 230V of the second channel layer 230, that is, the other side surface of the second vertical transistor structure TS2, opposite to the second gate electrode 250. In some other embodiments, the second vertical cover insulating layer 262 and the second filling insulating layer 268 may sequentially cover the other side surface of the second vertical transistor structure TS2.

Each of the first interlayer insulating layer 160 and the second interlayer insulating layer 260 may include at least one of oxide, oxynitride, nitride, and a combination thereof, but is not limited thereto. For example, each of the first vertical cover insulating layer 162, the first horizontal cover insulating layer 166, the second vertical cover insulating layer 262, and the second horizontal cover insulating layer 266 may include silicon nitride, and each of the first filling insulating layer 168 and the second filling insulating layer 268 may include silicon oxide.

The plurality of second connection contacts 270 may pass through the second interlayer insulating layer 260 such that lower surfaces thereof may be connected to the plurality of first channel layers 130. For example, the plurality of second connection contacts 270 may fill portions of a plurality of second contact holes 270H passing through the second filling insulating layer 268. In some embodiments, when upper surfaces of the plurality of first channel layers 130 are at a lower vertical level than the upper surface of the first interlayer insulating layer 160, the plurality of second contact holes 270H may pass through the second filling insulating layer 268 and extend into the first filling insulating layer 168, and the plurality of second connection contacts 270 may pass through the second interlayer insulating layer 260 and extend into the first filling insulating layer 168 such that lower surfaces thereof may be connected to the plurality of first channel layers 130.

Each of the plurality of first connection contacts 170 and the plurality of second connection contacts 270 may include a conductive material, for example, at least one of metal, conductive metal nitride, conductive metal carbonitride, conductive metal carbide, metal silicide, a doped semiconductor material, conductive metal oxynitride, conductive metal oxide, and a 2D material, but is not limited thereto.

A plurality of second side surface insulating layers 275 may be disposed on and cover inner side surfaces of the plurality of second contact holes 270H. The plurality of second side surface insulating layers 275 may be disposed on and cover the second filling insulating layer 268 exposed on the inner side surfaces of the plurality of second contact holes 270H. In some embodiments, the plurality of second side surface insulating layers 275 may be disposed on and cover the second filling insulating layer 268 and the first filling insulating layer 168 that are exposed on the inner side surfaces of the plurality of second contact holes 270H. Each of the plurality of second side surface insulating layers 275 may have a hollow cylindrical shape, and each of the plurality of second connection contacts 270 may fill the cylindrical shape of each of the plurality of second side surface insulating layers 275. The plurality of second side surface insulating layers 275 may be between the plurality of second connection contacts 270 and the second interlayer insulating layer 260. For example, the plurality of second side surface insulating layers 275 may be between the plurality of second connection contacts 270 and the second filling insulating layer 268.

Each of the plurality of first side surface insulating layers 175 and the plurality of second side surface insulating layers 275 may include at least one of oxide, oxynitride, nitride, and a combination thereof, but is not limited thereto. For example, each of the plurality of first side surface insulating layers 175 and the plurality of second side surface insulating layers 275 may include silicon nitride.

The plurality of second connection contacts 270 may be arranged adjacent to the plurality of second vertical transistor structures TS2. Each of the plurality of second connection contacts 270 may be arranged adjacent to one side surface of each of the plurality of second vertical transistor structures TS2 corresponding thereto. For example, each of the plurality of second connection contacts 270 may be arranged adjacent to the second horizontal portion 230H and the second insulating horizontal portion 240H, rather than the second vertical portion 230V and the second insulating vertical portion 240V, included in each of the plurality of second vertical transistor structures TS2 corresponding thereto. Each of the plurality of second connection contacts 270 may be arranged adjacent to each of the plurality of second vertical transistor structures TS2 corresponding thereto in the direction opposite to the first horizontal direction (X direction). The second connection contact 270 and the second vertical transistor structure TS2 may be alternately arranged in the first horizontal direction (X direction). That is, a second connection contact 270 is arranged, then moving in the horizontal direction, a second vertical transistor structure TS2 is arranged, then a second connection contact 270, then another second vertical transistor structure TS2, and so on.

Among the plurality of second vertical transistor structures TS2, a pair of second vertical transistor structures TS2 adjacent to each other in the first horizontal direction (X direction) may be referred to as a second left vertical transistor structure TS2L and a second right vertical transistor structure TS2R, respectively. The second channel layer 230 and the second gate dielectric layer 240 included in each of the second left vertical transistor structure TS2L and the second right vertical transistor structure TS2R may each have an inverted L-shaped vertical cross-section. The second connection contact 270 corresponding to each of the second left vertical transistor structure TS2L and the second right vertical transistor structure TS2R may be arranged adjacent to each of the second left vertical transistor structure TS2L and the second right vertical transistor structure TS2R in the direction opposite to the first horizontal direction (X direction). The second left vertical transistor structure TS2L and the second connection contact 270 corresponding thereto may be arranged on the first left vertical transistor structure TS1L and the first connection contact 170 corresponding thereto, and the second right vertical transistor structure TS2R and the second connection contact 270 corresponding thereto may be arranged on the first right vertical transistor structure TS1R and the first connection contact 170 corresponding thereto.

In some embodiments, when the uppermost end of the second channel layer 230 is at a lower vertical level than an upper surface of the second interlayer insulating layer 260, the semiconductor memory device 1 may further include a plurality of third connection contacts 280 that pass through an upper portion of the second interlayer insulating layer 260 from the upper surface of the second interlayer insulating layer 260 such that lower surfaces thereof may be connected to the plurality of second channel layers 230. For example, the plurality of third connection contacts 280 may fill portions of a plurality of third contact holes 280H passing through an upper portion of the second filling insulating layer 268.

For example, a plurality of third side surface insulating layers 285 may be between the plurality of third connection contacts 280 and the second filling insulating layer 268. A plurality of third side surface insulating layers 285 may be disposed on and cover inner side surfaces of the plurality of third contact holes 280H. Each of the plurality of third side surface insulating layers 285 may surround at least a portion of each of the plurality of third connection contacts 280.

Each of the plurality of first connection contacts 170, the plurality of second connection contacts 270, and the plurality of third connection contacts 280 may include a conductive material, for example, at least one of metal, conductive metal nitride, conductive metal carbonitride, conductive metal carbide, metal silicide, a doped semiconductor material, conductive metal oxynitride, conductive metal oxide, and a 2D material, but embodiments are not limited thereto.

Each of the plurality of first side surface insulating layers 175, the plurality of second side surface insulating layers 275, and the plurality of third side surface insulating layers 285 may include at least one of oxide, oxynitride, nitride, and a combination thereof, but is not limited thereto. For example, each of the plurality of first side surface insulating layers 175, the plurality of second side surface insulating layers 275, and the plurality of third side surface insulating layers 285 may include silicon nitride.

A plurality of second connection pads 290 may be arranged on the plurality of second connection contacts 270 and the plurality of third connection contacts 280. The plurality of second connection contacts 270 may electrically connect some of the plurality of second connection pads 290 and the plurality of first channel layers 130 to each other, and the plurality of third connection contacts 280 may electrically connect some other ones of the plurality of second connection pads 290 and the plurality of second channel layers 230 to each other. In some embodiments, the plurality of second connection pads 290 may be at a higher vertical level than a plurality of second gate dielectric layers 240. For example, upper surfaces of the plurality of second connection pads 290 may be at a higher vertical level than upper surfaces of the plurality of second gate dielectric layers 240. In some embodiments, lower surfaces of the plurality of second connection pads 290 may be at the same vertical level as an upper surface of the second filling insulating layer 268.

In some embodiments, the upper surfaces of the plurality of second gate dielectric layers 240, upper surfaces of the plurality of second horizontal cover insulating layers 266, the upper surface of the second filling insulating layer 268, and upper surfaces of the plurality of second side surface insulating layers 275 may be coplanar with each other. For example, the lower surfaces of the plurality of second connection pads 290 may be at the same vertical level as the upper surfaces of the plurality of second gate dielectric layers 240, the upper surfaces of the plurality of second horizontal cover insulating layers 266, the upper surface of the second filling insulating layer 268, and the upper surfaces of the plurality of second side surface insulating layers 275.

A supporting insulating layer 400 may be arranged on the second interlayer insulating layer 260. The supporting insulating layer 400 may surround the plurality of second connection pads 290. The supporting insulating layer 400 may include, for example, a silicon nitride layer or a silicon boron nitride (SiBN) layer. An upper surface of the supporting insulating layer 400 may be at the same vertical level as the upper surfaces of the plurality of second connection pads 290, but embodiments are not limited thereto. In some embodiments, the upper surfaces of the plurality of second connection pads 290 may be at a lower vertical level than the upper surface of the supporting insulating layer 400. In some other embodiments, the upper surfaces of the plurality of second connection pads 290 may be at a higher vertical level than the upper surface of the supporting insulating layer 400.

The plurality of capacitor structures 500 may be respectively formed on the plurality of second connection pads 290. The plurality of capacitor structures 500 may be respectively connected to the upper surfaces of the plurality of second connection pads 290 respectively corresponding thereto. The capacitor structure 500 may be controlled by the conductive line 120 and the first gate electrode 150 or by the conductive line 120 and the second gate electrode 250 to store data.

The plurality of capacitor structures 500 may include the plurality of lower electrodes 510, the capacitor dielectric layer 520, and the upper electrode 530. Each of the plurality of capacitor structures 500 may store electric charges in the capacitor dielectric layer 520 by using a potential difference generated between the lower electrode 510 and the upper electrode 530.

The plurality of lower electrodes 510 may be respectively connected to the plurality of second connection pads 290. For example, lower surfaces of the plurality of lower electrodes 510 may be respectively connected to the upper surfaces of the plurality of second connection pads 290. In some embodiments, the lower surfaces of the plurality of lower electrodes 510 may be connected to at least portions of the upper surfaces of the plurality of second connection pads 290 and a portion of the upper surface of the supporting insulating layer 400. In FIG. 1, the lower electrode 510 has a pillar shape extending from the upper surface of the second connection pad 290 in the vertical direction (Z direction), but other embodiments may have other configurations. For example, in some embodiments, the lower electrode 510 may have a cylindrical shape extending from the upper surface of the second connection pad 290 in the vertical direction (Z direction). In some embodiments, the plurality of lower electrodes 510 may be arranged in a matrix form. In some other embodiments, the plurality of lower electrodes 510 may be arranged in a honeycomb shape. The lower electrode 510 may include silicon doped with impurities, metal such as tungsten or copper, or a conductive metal compound such as titanium nitride.

The capacitor dielectric layer 520 may be formed on the plurality of lower electrodes 510. In some embodiments, the capacitor dielectric layer 520 may conformally extend along profiles of side and upper surfaces of the plurality of lower electrodes 510 and the upper surface of the supporting insulating layer 400. The capacitor dielectric layer 520 may include, for example, TaO, TaAlO, TaON, AlO, AlSiO, HfO, HfSiO, ZrO, ZrSiO, TiO, TiAlO, (Ba,Sr)TiO (BST), SrTiO (STO), BaTiO (BTO), Pb(Zr, Ti)O (PZT), (Pb, La)(Zr, Ti)O, Ba(Zr, Ti)O, Sr(Zr, Ti)O, or a combination thereof.

The upper electrode 530 may be formed on the capacitor dielectric layer 520. The upper electrode 530 may include a metal material. For example, the upper electrode 530 may include TiN, Ni, W, Ru, RuO, Pt, PtO, Ir, IrO, SrRuO (SRO), (Ba, Sr)RuO (BSRO), CaRuO (CRO), BaRuO, La(Sr, Co)O, or a combination thereof. In some embodiments, the upper electrode 530 may include a main electrode, and at least one of a doped semiconductor material layer and an interfacial layer so that the main electrode includes a stacked structure, and at least one of the doped semiconductor material layer and the interfacial layer. The doped semiconductor material layer may include, for example, at least one of doped polysilicon and doped polycrystalline silicon germanium (poly-SiGe). The main electrode layer may include a metal material. The interfacial layer may include, for example, at least one of metal oxide, metal nitride, metal carbide, and metal silicide. In FIG. 1, the upper electrode 530 fills a region between the lower electrodes 510 adjacent to each other, but this is just an example. As another example, the upper electrode 530 may conformally extend along a profile of the capacitor dielectric layer 520.

In the semiconductor memory device 1 according to example embodiments, the first cell stack CS1 including the plurality of first vertical transistor structures TS1 and a second cell stack CS2 including the plurality of second vertical transistor structures TS2 are stacked. Accordingly, in the semiconductor memory device 1 according to example embodiments, the number of memory cells per unit area may be increased to enable high integration, and a distance between memory cells at the same vertical level may be secured, thereby preventing disturbance between adjacent memory cells.

FIGS. 2A to 18 are cross-sectional views and a plan view illustrating a method of manufacturing the semiconductor memory device 1, according to embodiments. In detail, FIGS. 2A, 3A, 4A, 5A, 6A, 7A, 8A, 9A, 10A, 11A, 12A, 13A, 14A, 15, 16, 17, and 18 are cross-sectional views taken along the line A-A' of FIG. TA, FIGS. 2B, 3B, 4B, 5B, 6B, 7B, 8B, 9B, 10B, 11B, 12B, 13B, and 14B are cross-sectional views taken along a line B-B' of FIG. 1A, and FIGS. 7A and 7B are cross-sectional views taken along lines VIIA-VIIA' and VIIB-VIIB' of FIG. 7C, which is a plan view.

Figure 2A:
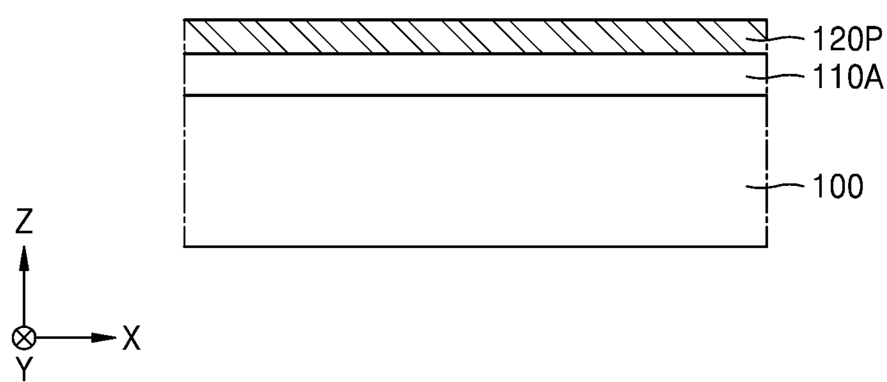
FIGS. 2A to 18 are cross-sectional views and a plan view illustrating a method of manufacturing a semiconductor memory device, according to embodiments.
Figure 2B:
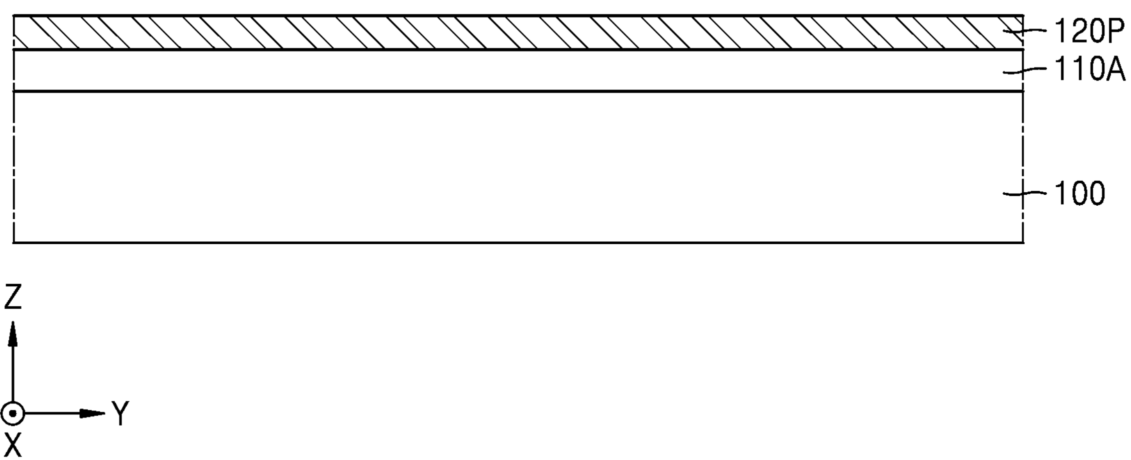

Referring to FIGS. 2A and 2B together, a conductive material layer 120P is formed on a substrate 100. The conductive material layer 120P may be formed to include doped polysilicon, metal, conductive metal nitride, conductive metal silicide, conductive metal oxide, or a combination thereof.

Before forming the conductive material layer 120P, a first interline insulating layer 110A may be formed on and to cover an upper surface of the substrate 100. The conductive material layer 120P may be formed on and to cover an upper surface of the first interline insulating layer 110A.

Figure 3A:
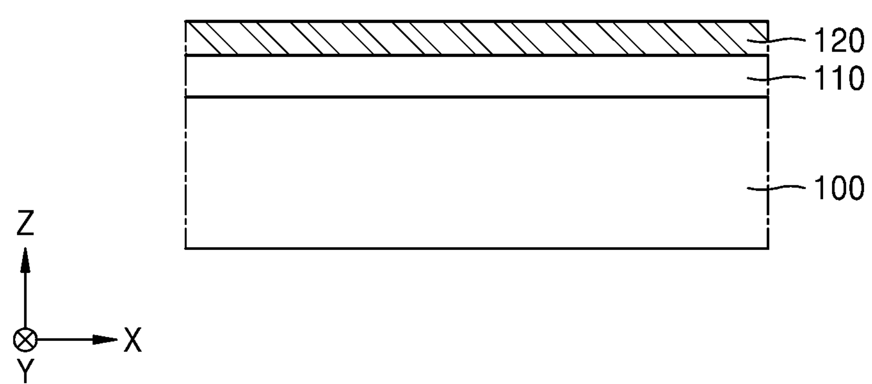
Figure 3B:
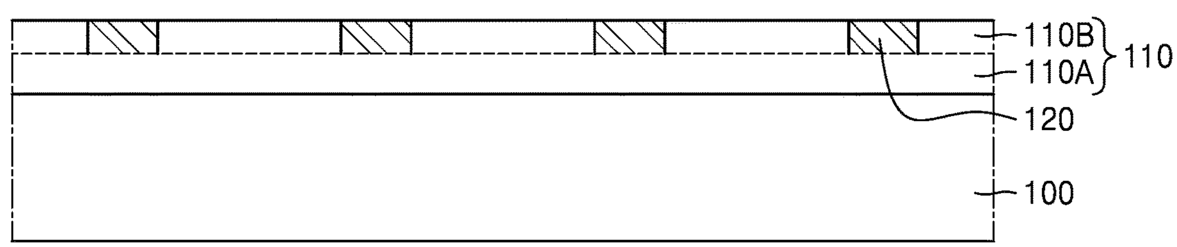

Referring to FIGS. 3A and 3B together, a plurality of conductive lines 120 are formed by patterning the conductive material layer 120P. The plurality of conductive lines 120 may extend in a first horizontal direction (X direction), and may be formed apart from each other at equal intervals in a second horizontal direction (Y direction).

After forming the plurality of conductive lines 120, a second interline insulating layer 110B surrounding side surfaces of the plurality of conductive lines 120 may be formed on the first interline insulating layer 110A. A stacked structure including both the first interline insulating layer 110A and the second interline insulating layer 110B may be referred to as an interline insulating layer 110. That is, the interline insulating layer 110 includes the first interline insulating layer 110A and the second interline insulating layer 1101B. In some embodiments, the second interline insulating layer 110B may be formed at the same vertical level as upper surfaces of the plurality of conductive lines 120.

Figure 4A:
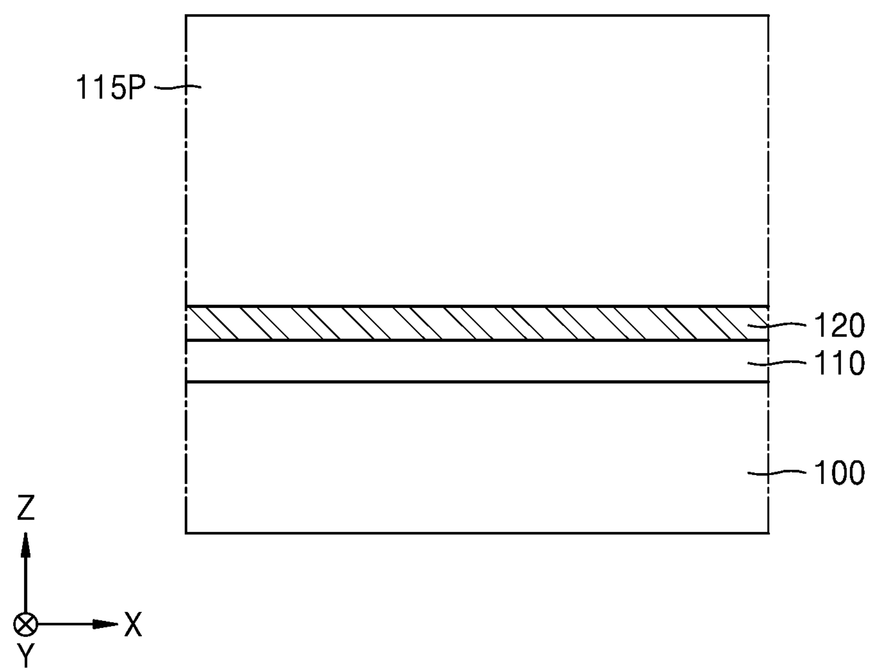
Figure 4B:
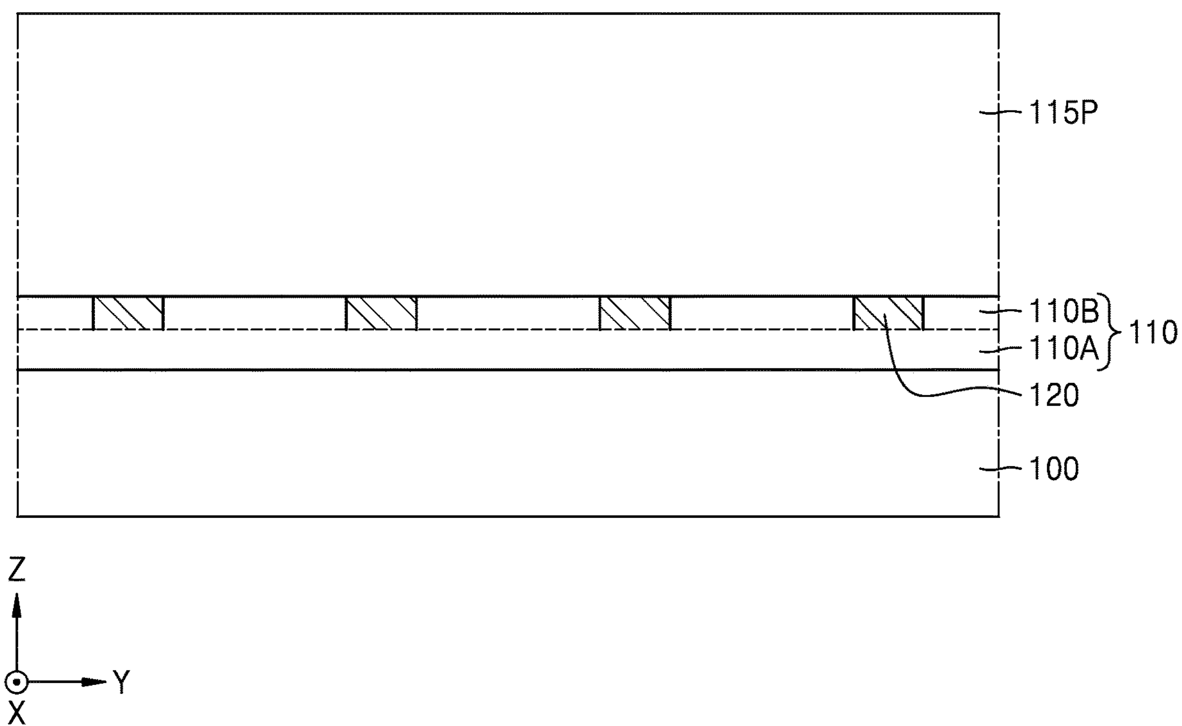

Referring to FIGS. 4A and 4B together, a preliminary isolation insulating layer 115P is formed on the plurality of conductive lines 120 and the interline insulating layer 110. The preliminary isolation insulating layer 115P may include oxide, nitride, or a combination thereof. In some embodiments, the preliminary isolation insulating layer 115P may be formed as a stacked structure including a nitride layer and an oxide layer.

Figure 5A:
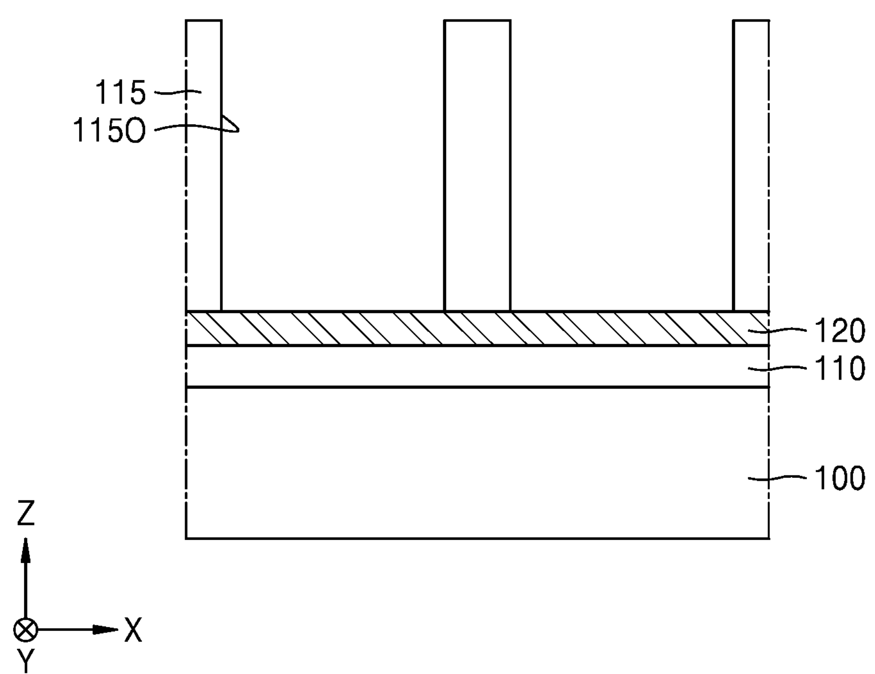
Figure 5B:
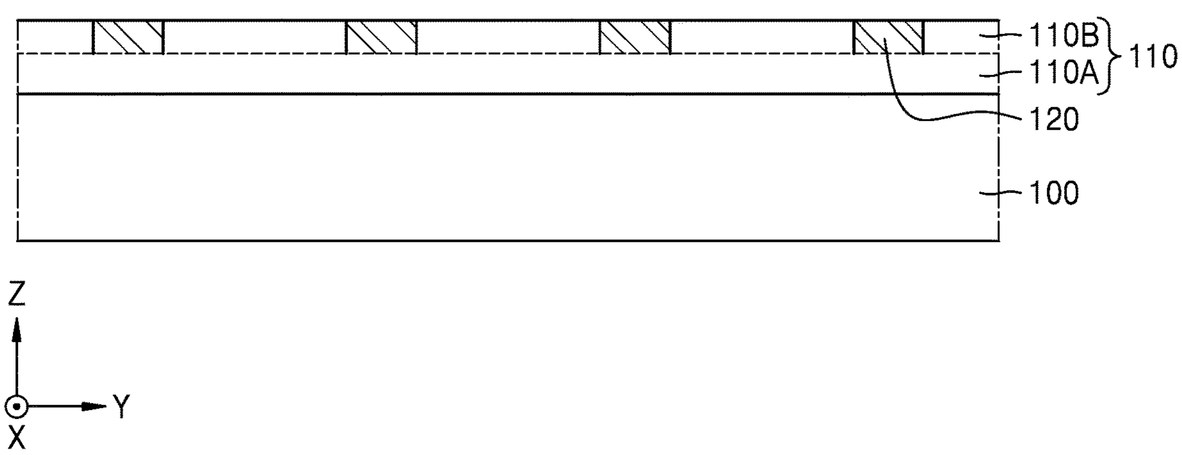

Referring to FIGS. 4A, 4B, 5A, and 5B together, a plurality of isolation insulating layers 115 are formed by patterning the preliminary isolation insulating layer 115P. The plurality of isolation insulating layers 115 may extend in the second horizontal direction (Y direction), and may be formed apart from each other at equal intervals in the first horizontal direction (X direction). A channel trench 1150 extending long in the second horizontal direction (Y direction) may be formed between the plurality of isolation insulating layers 115. FIG. 5B may be a cross-sectional view illustrating a Y-Z plane taken from a central portion of the channel trench 1150 shown in FIG. 5A in the first horizontal direction (X direction).

Figure 6A:
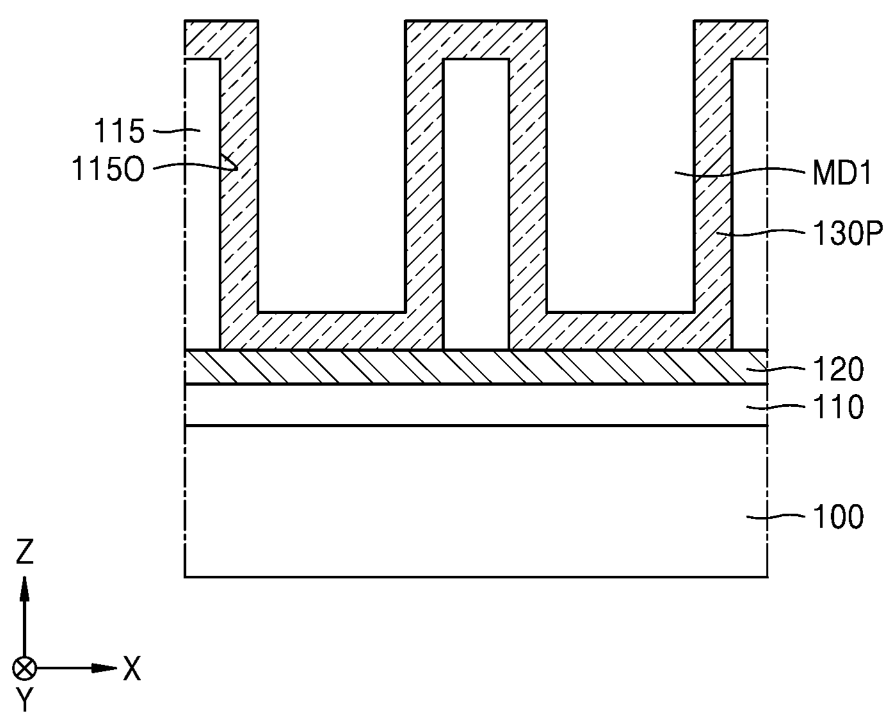
Figure 6B:
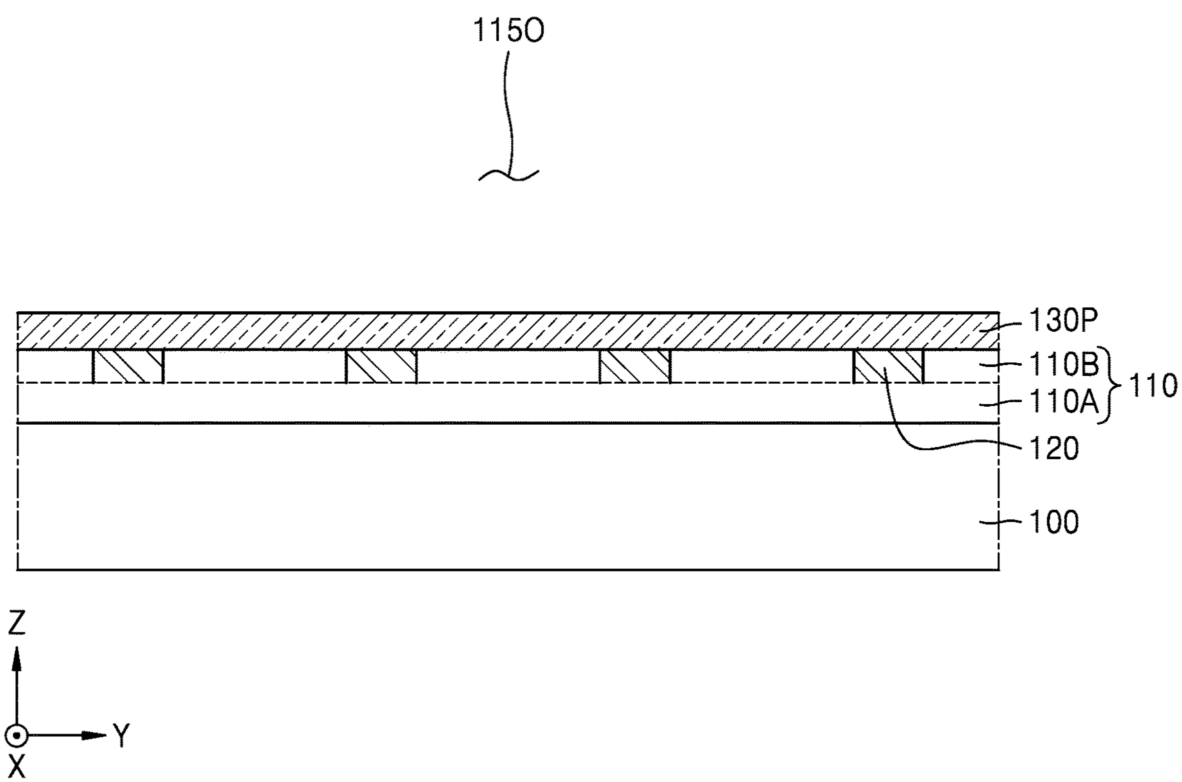
Figure 7A:
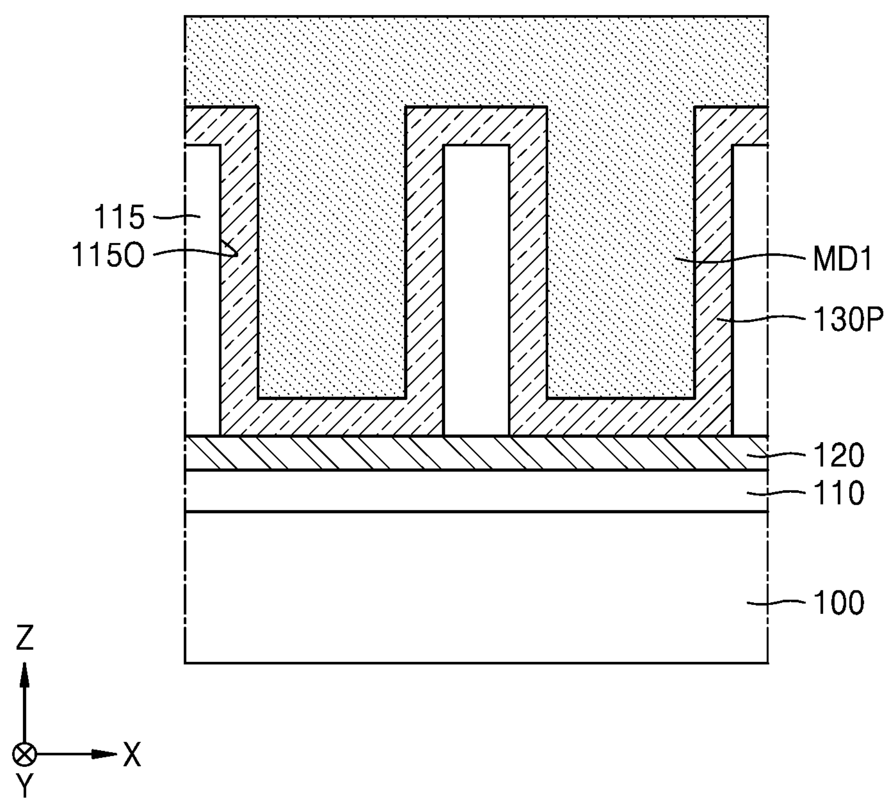
Figure 7B:
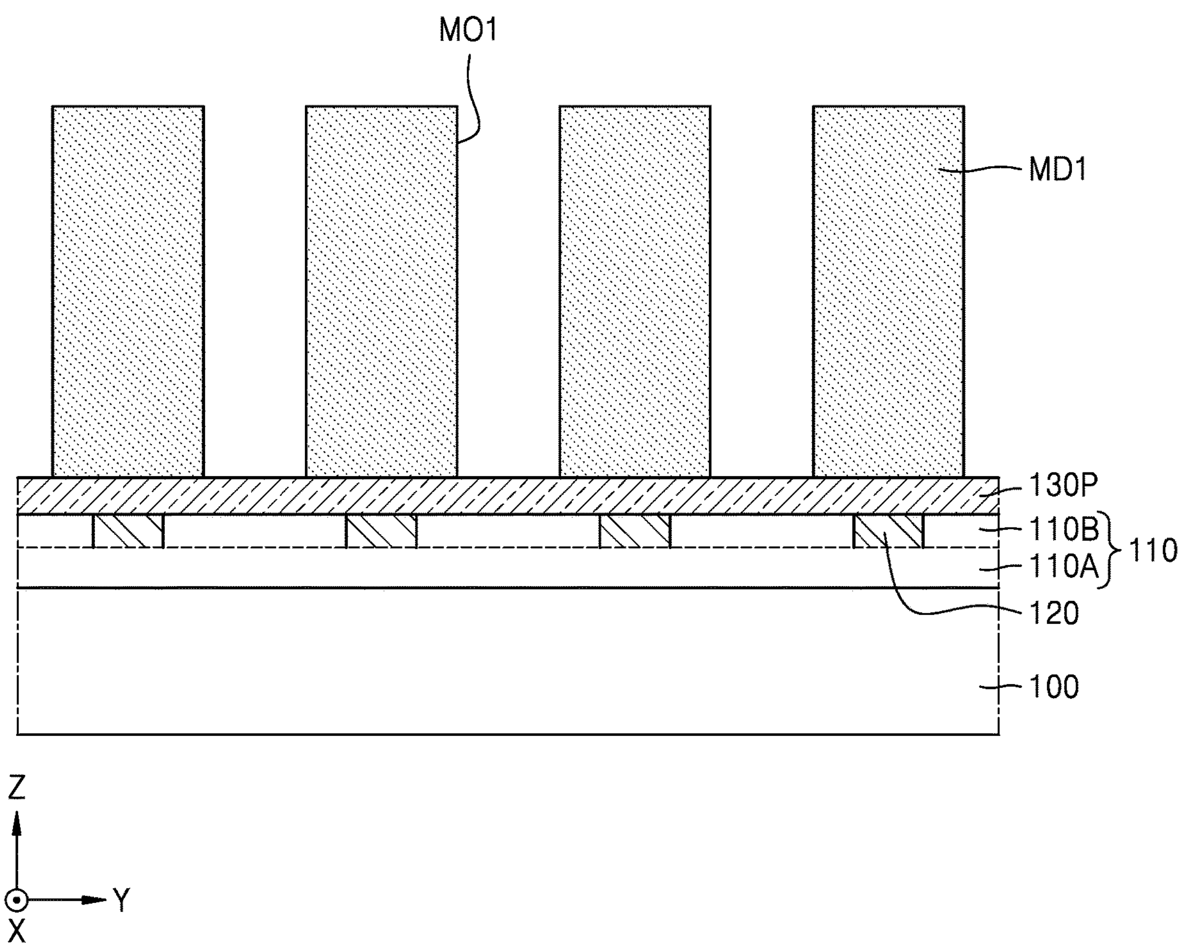

Referring to FIGS. 6A and 6B together, a first preliminary channel layer 130P is formed on and to cover a surface of the resultant of FIGS. 5A and 5B. The first preliminary channel layer 130P may be formed to conformally be disposed on and cover upper surfaces and side surfaces of the plurality of isolation insulating layers 115, upper surfaces of the plurality of conductive lines 120 on a lower surface of the channel trench 1150, and an upper surface of the interline insulating layer 110.

Figure 7C:
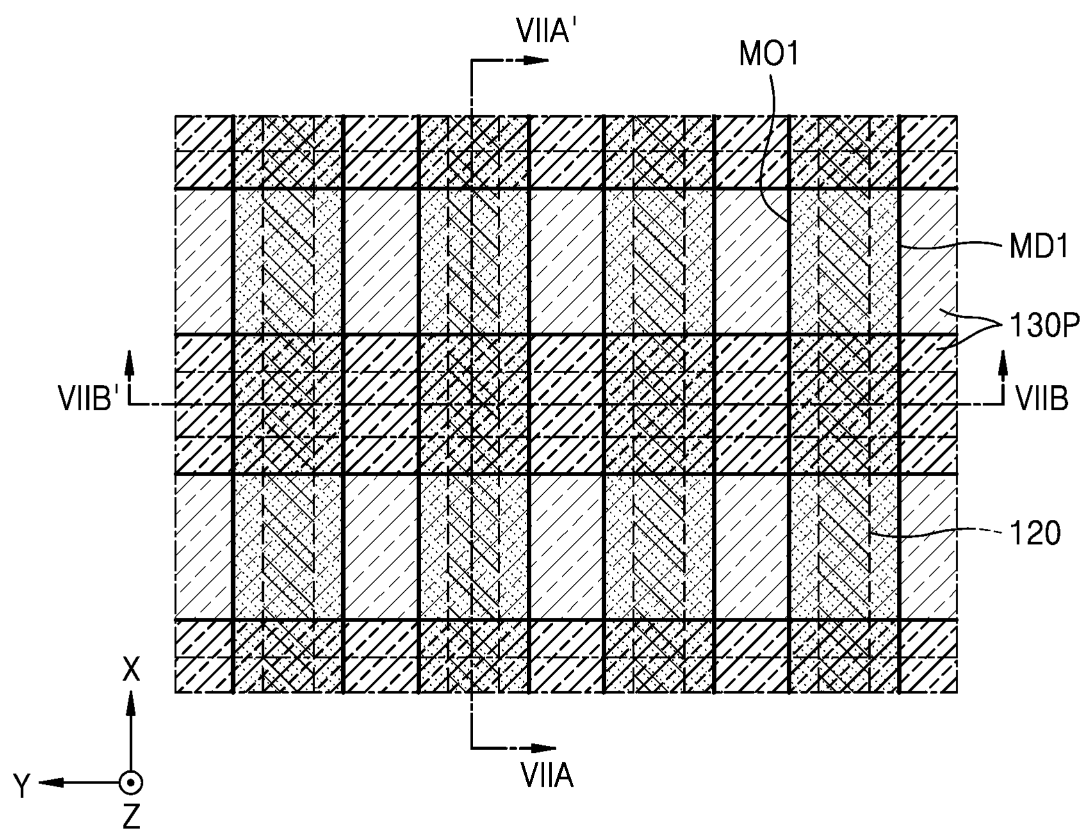
Figure 8A:
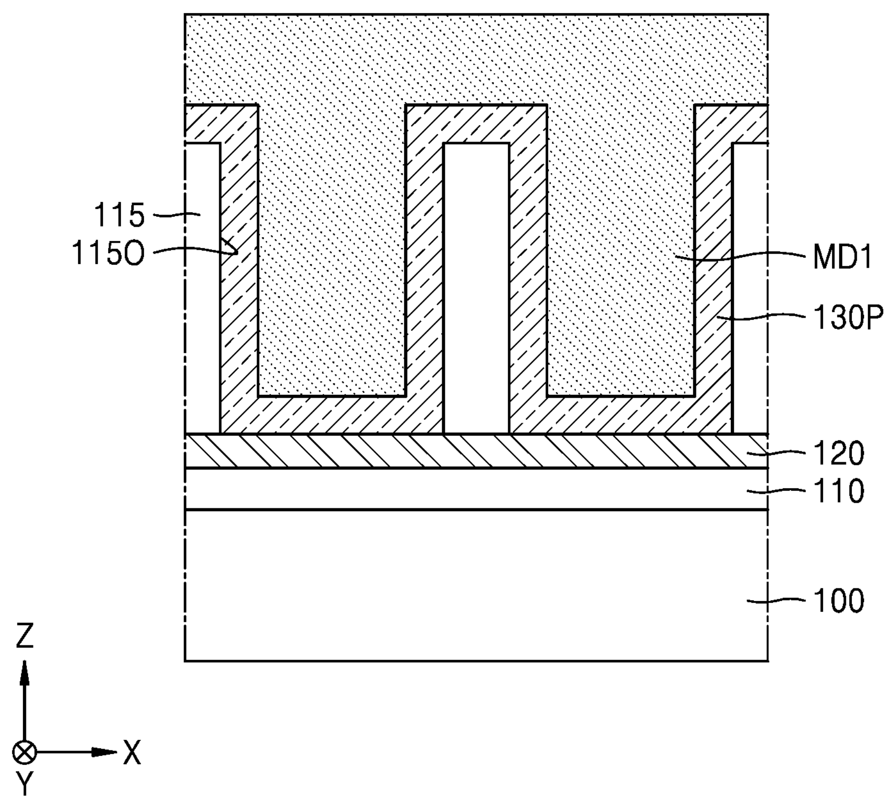
Figure 8B:
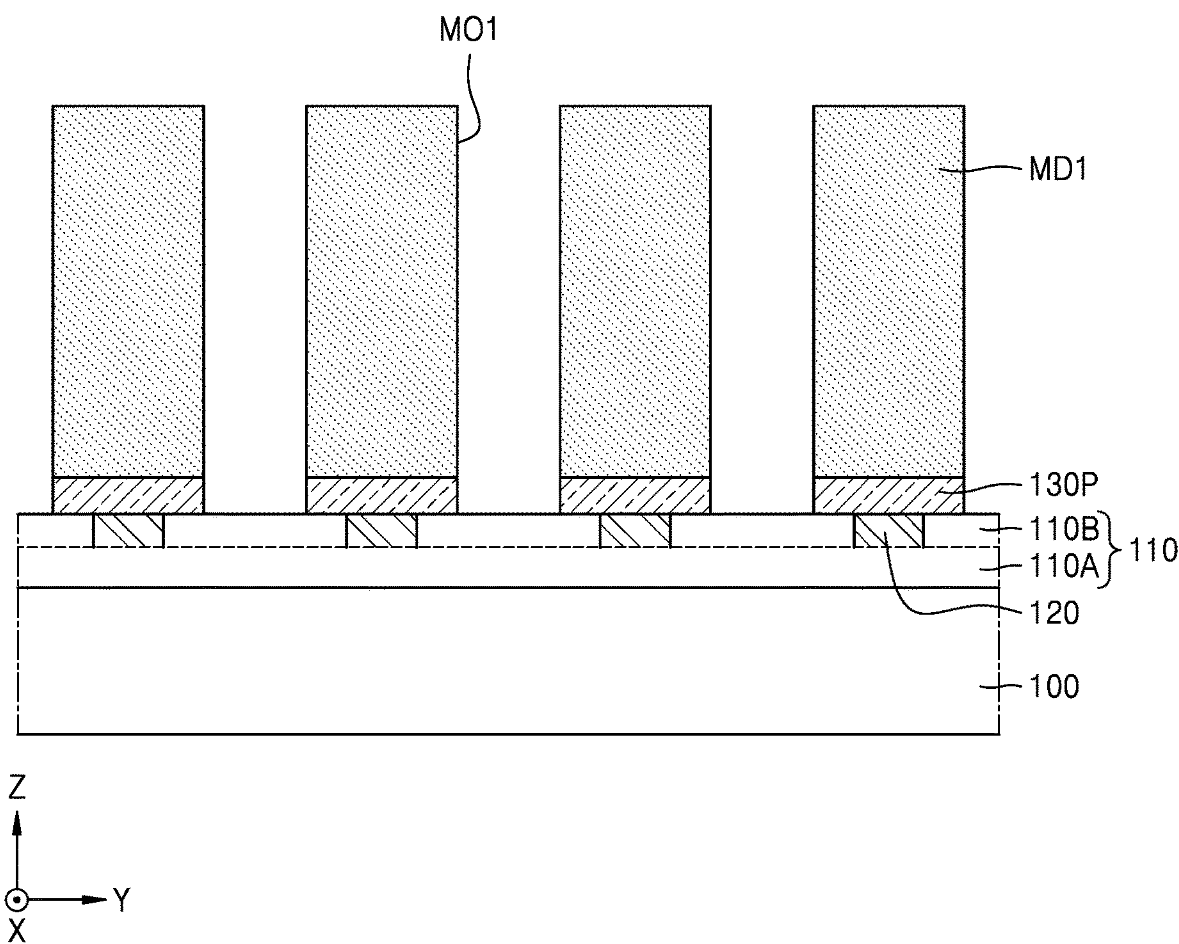

Referring to FIGS. 7A to 7C together, a plurality of first mold layers MD1 are formed on and to cover the first preliminary channel layer 130P and to fill a portion of the channel trench 1150. Each of the plurality of first mold layers MD1 may extend in the first horizontal direction (X direction). The plurality of first mold layers MD1 may be formed by forming a preliminary mold layer on and covering the first preliminary channel layer 130P and filling the channel trench 1150, and then patterning the preliminary mold layer. A mold opening MO1 may be defined between two adjacent first mold layers MD1 among the plurality of first mold layers MD1.

Referring to FIGS. 7A, 7B, 7C, 8A, and 8B together, portions of the first preliminary channel layer 130P exposed on lower surfaces of a plurality of mold openings MO1 are removed by using the plurality of first mold layers MD1 as etch masks. As the portions of the first preliminary channel layer 130P are removed, portions of the upper surface of the interline insulating layer 110 may be exposed on the lower surfaces of the plurality of mold openings MO1.

Figure 9A:
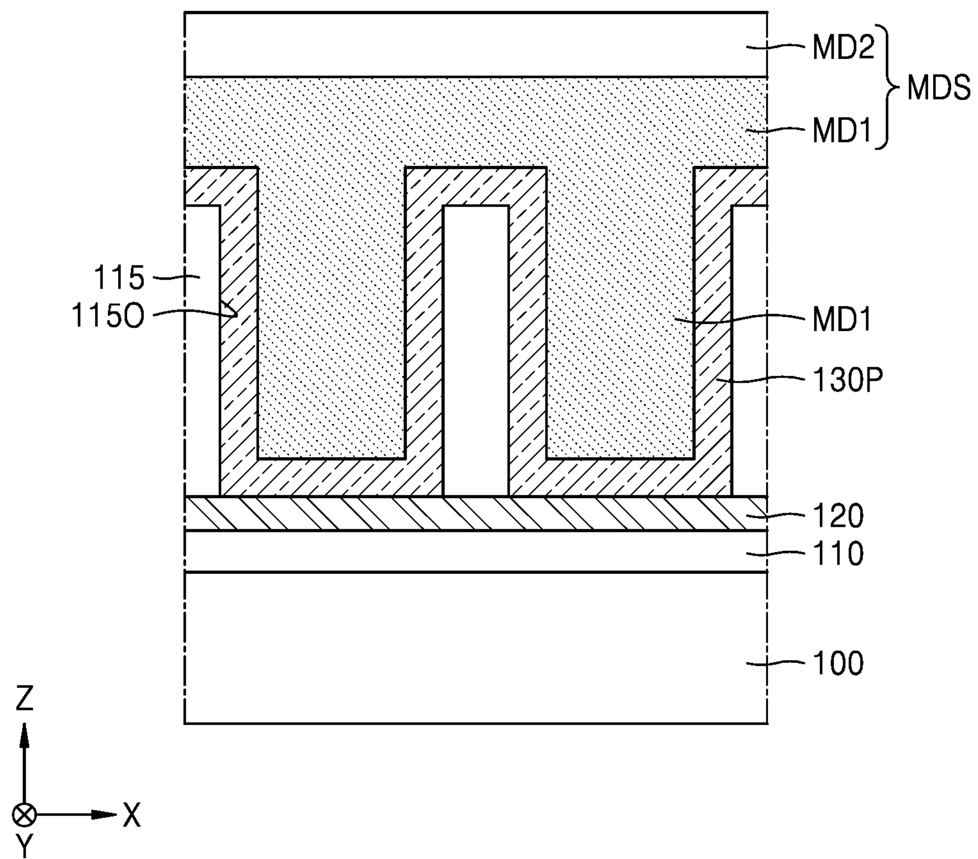
Figure 9B:
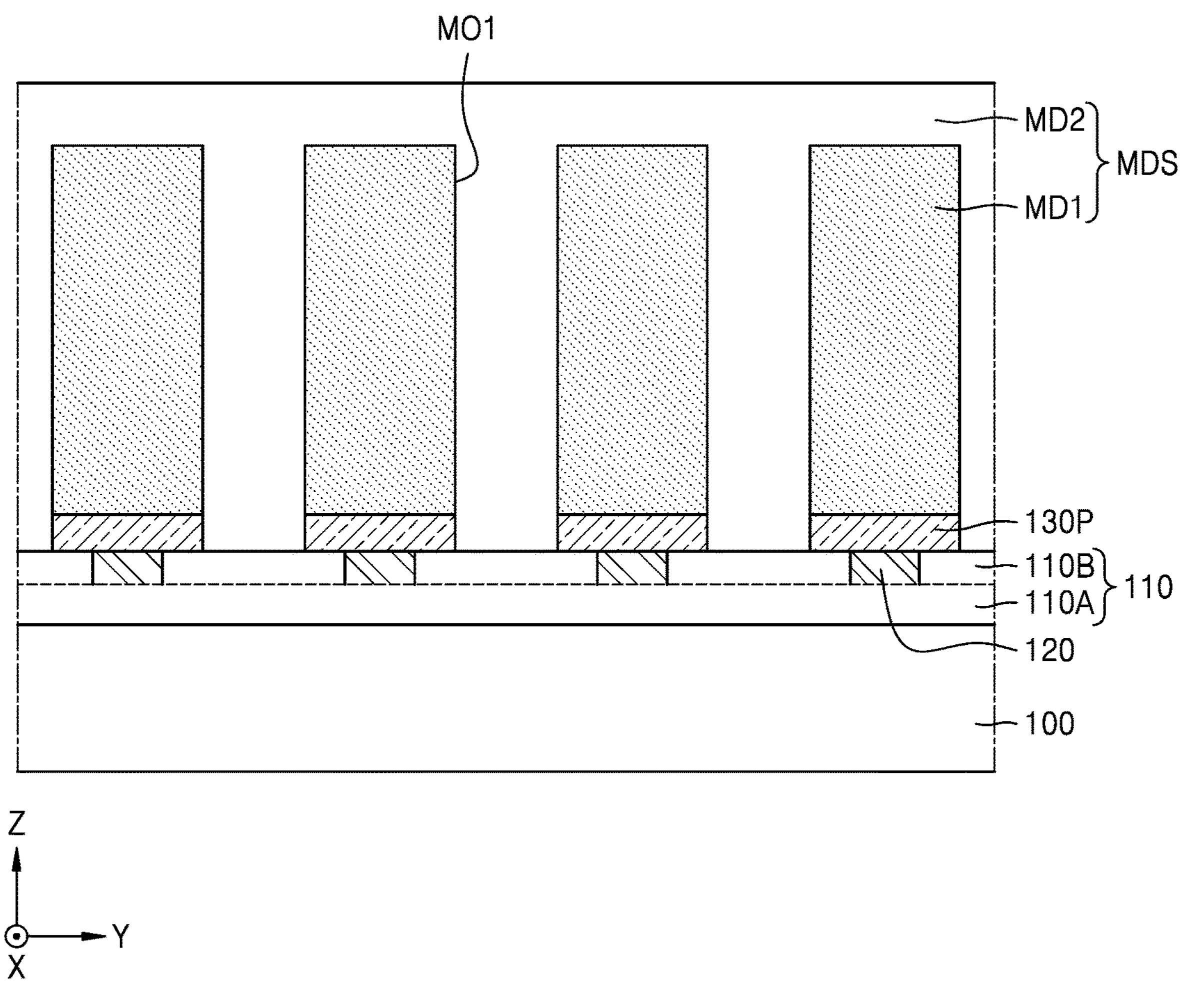

Referring to FIGS. 9A and 9B together, a second mold layer MD2 is formed to fill the plurality of mold openings MO1 and on and to cover upper surfaces of the plurality of first mold layers MD1. A stacked structure including the plurality of first mold layers MD1 and the second mold layer MD2 may be referred to as a mold structure MDS. That is, the mold structure MDS may include MD1 and MD2.

Figure 10A:
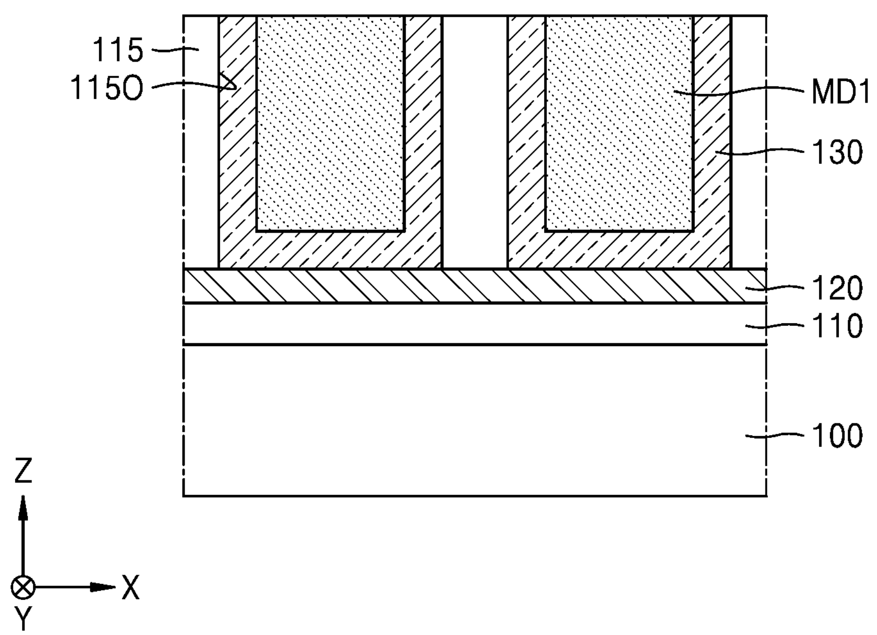
Figure 10B:
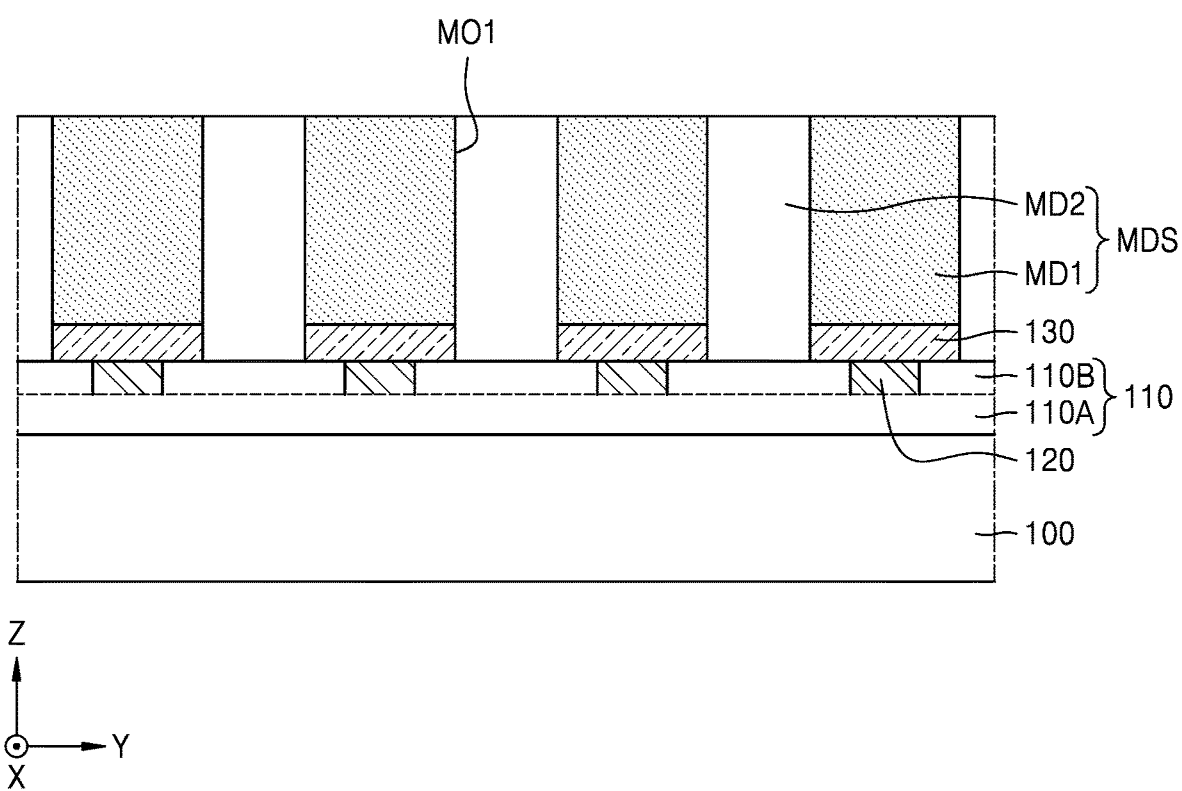
Figure 11A:
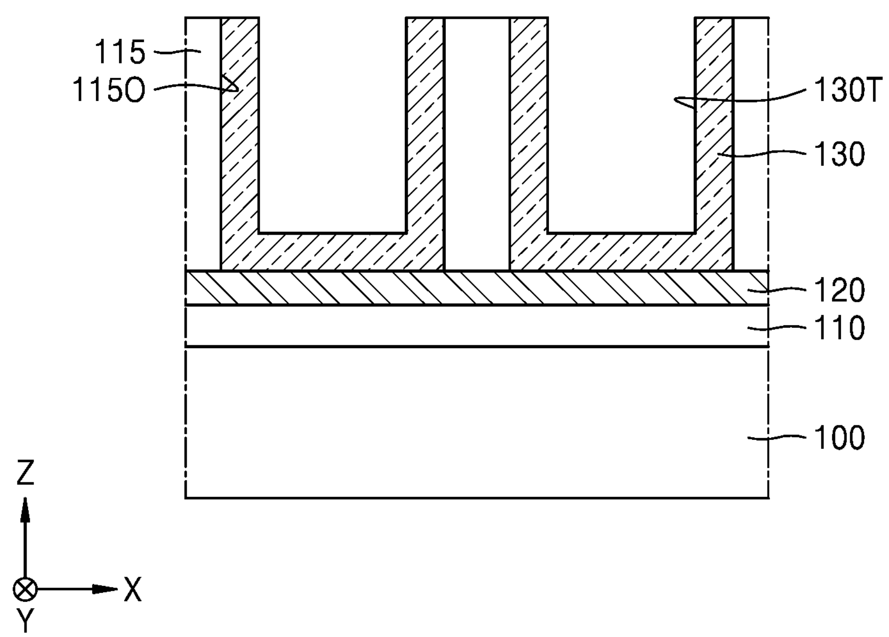
Figure 11B:
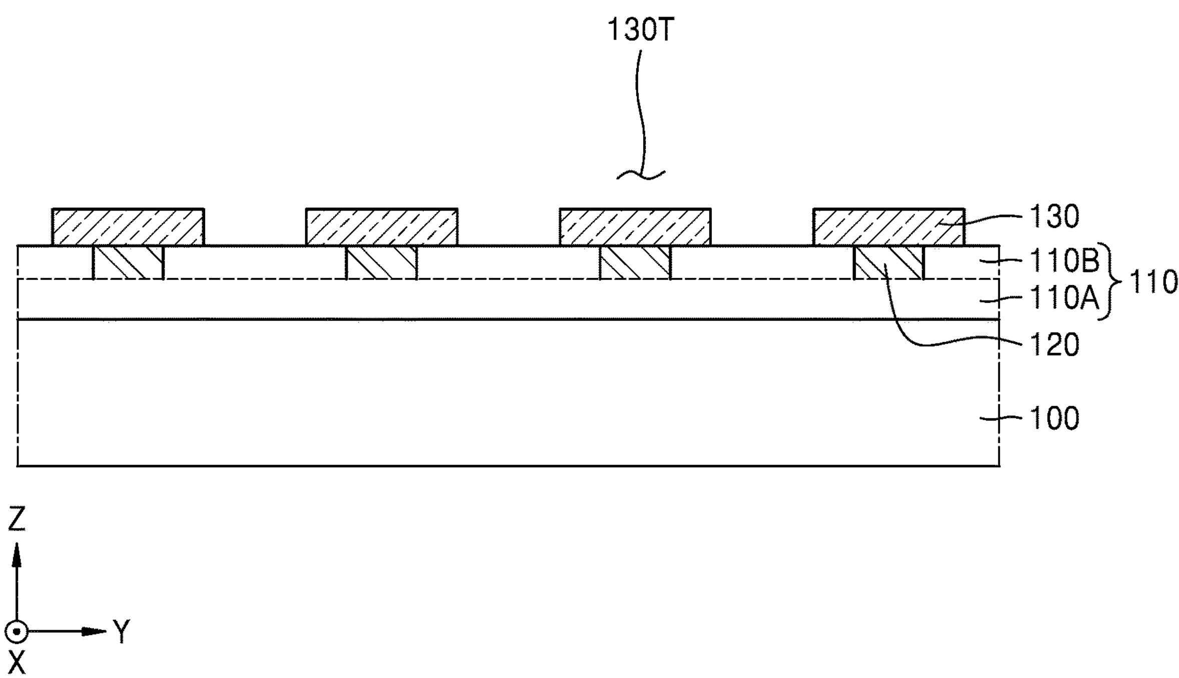

Referring to FIGS. 10A and 10B together, a plurality of first channel layers 130 are formed by removing an upper portion of the mold structure MDS and portions of the first preliminary channel layer 130P that cover upper surfaces of the plurality of isolation insulating layers 115. Each of the plurality of first channel layers 130 may be formed on and to cover an inner side surface and the lower surface of the channel trench 1150 and to have a U-shaped vertical cross-section.

Referring to FIGS. 10A, 10B, 11A, and 11B together, the mold structure MDS is removed. A gate trench 130T may be formed and defined inside each of the plurality of first channel layers 130 having a U-shaped vertical cross-section.

Figure 12A:
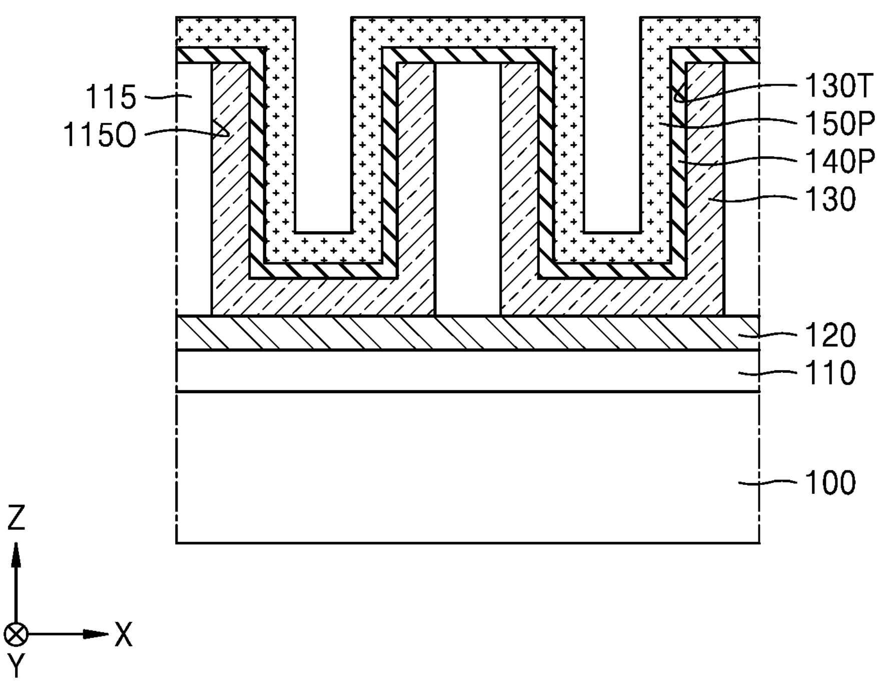
Figure 12B:
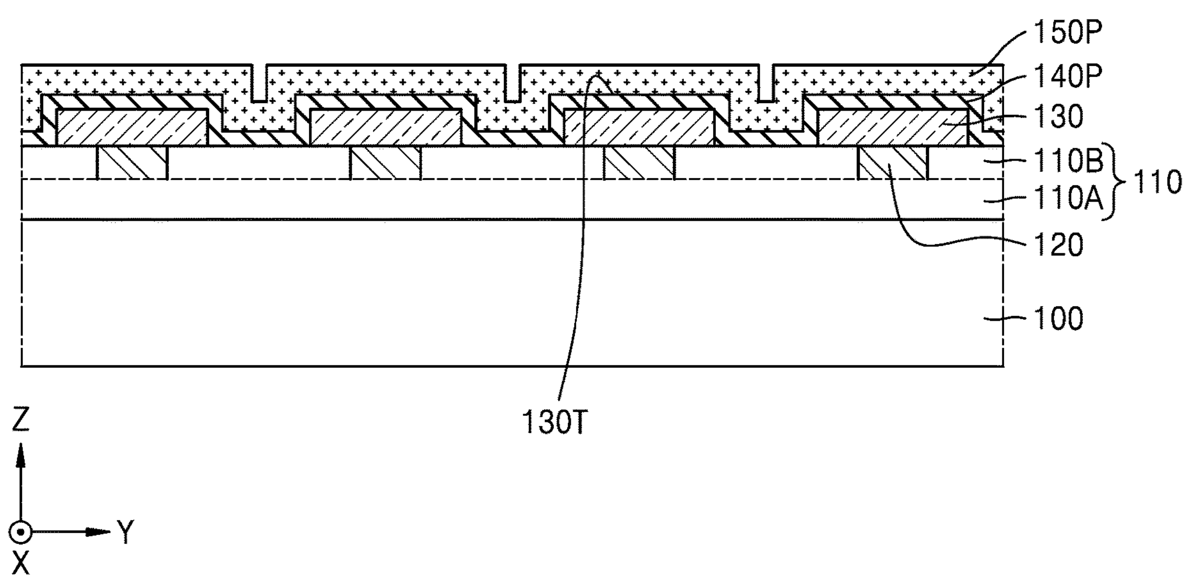
Figure 13A:
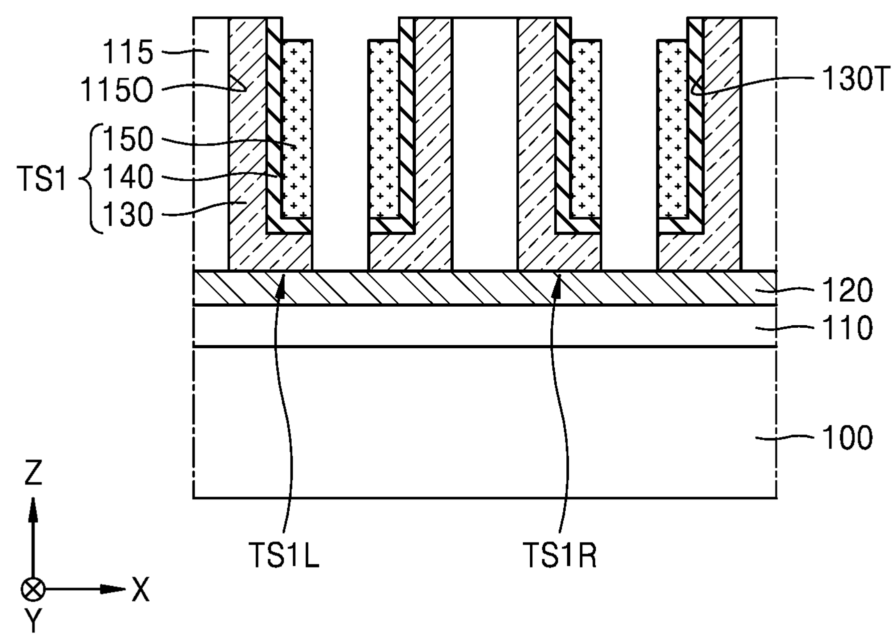
Figure 13B:
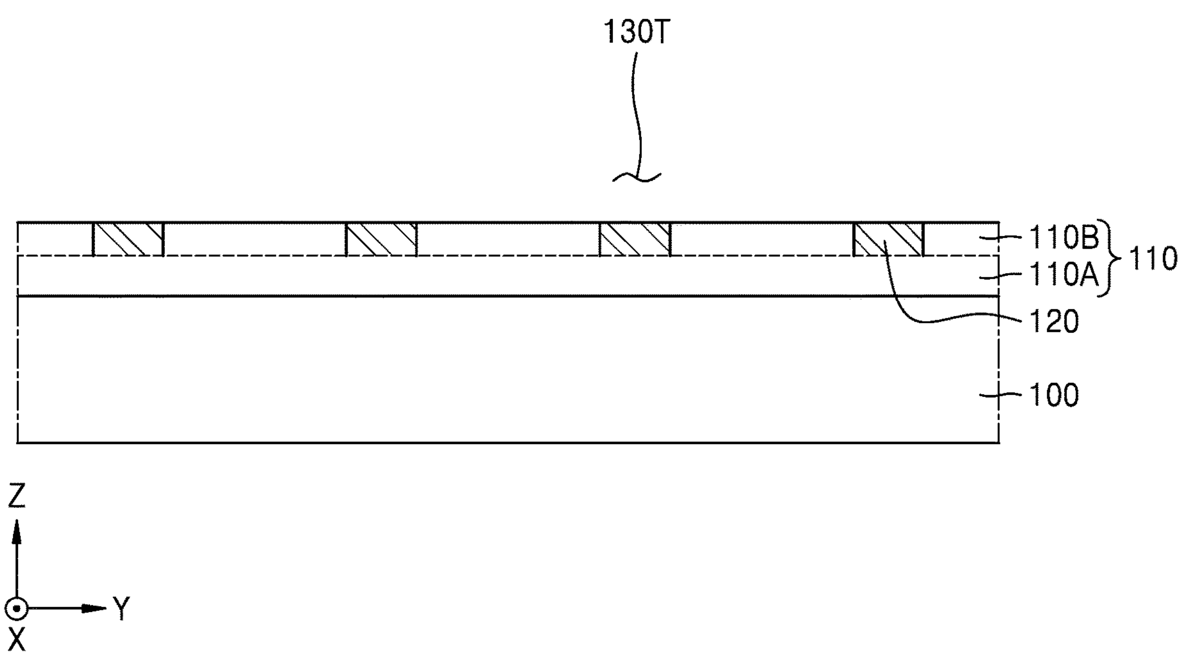

Referring to FIGS. 12A and 12B together, a first preliminary gate dielectric layer 140P and a first preliminary gate electrode 150P are sequentially formed on and to cover an inner side surface and a lower surface of the gate trench 130T. The first preliminary gate dielectric layer 140P and the first preliminary gate electrode 150P may be sequentially formed to conformally be on and cover the upper surfaces of the plurality of isolation insulating layers 115, upper surfaces of the plurality of first channel layers 130, and surfaces of the plurality of first channel layers 130 on inner side surfaces and lower surfaces of a plurality of gate trenches 130T. The first preliminary gate dielectric layer 140P and the first preliminary gate electrode 150P may be formed to only partially fill the plurality of gate trenches 130T.

Referring to FIGS. 12A, 12B, 13A, and 13B together, a first gate dielectric layer 140 and a first gate electrode 150 are formed by removing portions of the first preliminary gate dielectric layer 140P and portions of the first preliminary gate electrode 150P that cover the upper surfaces of the plurality of isolation insulating layers 115, upper surfaces of uppermost ends of the plurality of first channel layers 130, and portions of the lower surfaces of the plurality of gate trenches 130T. After removing portions of the first preliminary gate dielectric layer 140P and portions of first preliminary gate electrode 150P that are disposed on and cover portions of the lower surfaces of the plurality of gate trenches 130T, portions of the upper surfaces of the plurality of conductive lines 120 may be exposed by removing portions of the plurality of first channel layers 130 that are exposed on the lower surfaces of the plurality of gate trenches 130T, and each of the plurality of first channel layers 130 having a U-shaped vertical cross-section may be separated into a pair of first channel layers 130 respectively having an L-shaped vertical cross-section and an inverted L-shaped vertical cross-section. That is, in a pair of the first channel layers 130, one may have an L-shaped vertical cross-section and one may have an inverted L-shaped vertical cross-section.

In some embodiments, in the process of forming the first gate electrode 150, a portion of the first preliminary gate electrode 150P covering upper portions of the side surfaces of the plurality of isolation insulating layers 115 may be further removed such that an uppermost end of the first gate electrode 150 may be at a lower vertical level than an uppermost end of the first gate dielectric layer 140.

A pair of first gate dielectric layers 140 may be formed to respectively have an L-shaped vertical cross-section and an inverted L-shaped vertical cross-section that cover side surfaces and upper surfaces of the pair of first channel layers 130 in the gate trench 130T, and a pair of first gate electrodes 150 may be formed to each have an I-shaped vertical cross section covering the pair of first gate dielectric layers 140 in the gate trench 130T and extending in the vertical direction (Z direction). That is, in an embodiment, one first gate dielectric layer 140 of a pair has an L-shaped vertical cross-section and the other first gate dielectric layer 140 of the pair inverted L-shaped vertical cross-section.

Figure 14A:
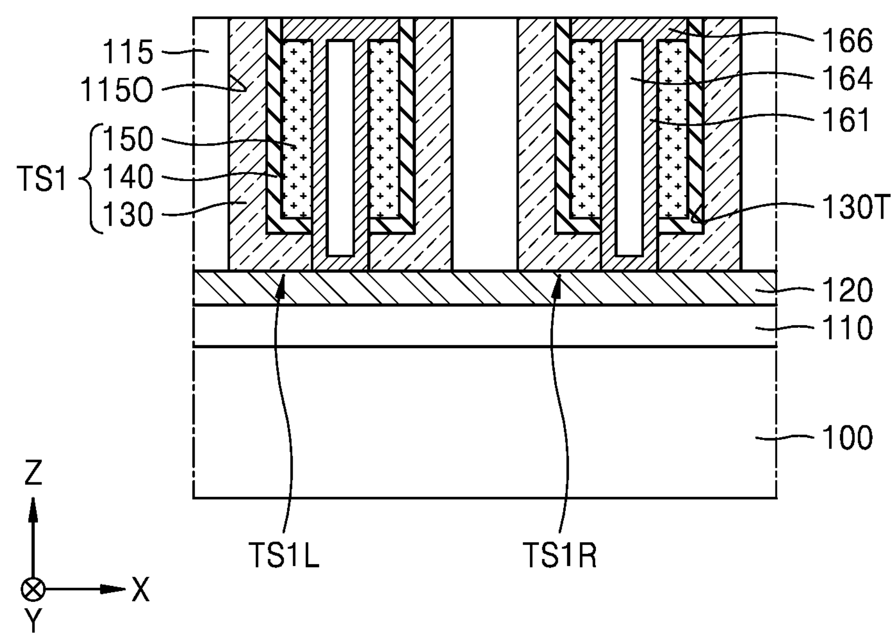
Figure 14B:
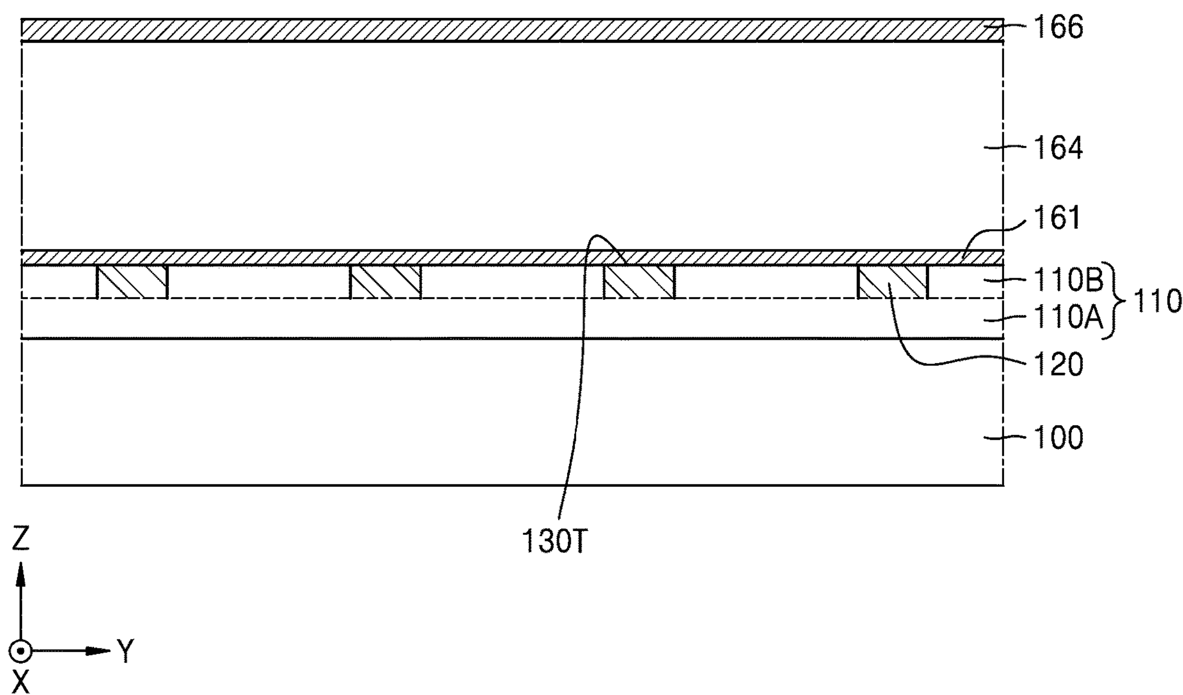

Referring to FIGS. 14A and 14B together, a first barrier insulating layer 161, a first gap-fill insulating layer 164, and a first horizontal cover insulating layer 166 are sequentially formed, the first barrier insulating layer 161 conformally covering a side surface of each of the first gate electrode 150, the first gate dielectric layer 140, and the first channel layer 130 and an upper surface of the conductive line 120 in the gate trench 130T, the first gap-fill insulating layer 164 covering the first barrier insulating layer 161 to fill a space defined by the first barrier insulating layer 161 in the gate trench 130T, and the first horizontal cover insulating layer 166 covering an upper surface of the first gate electrode 150, an upper surface of the first barrier insulating layer 161, and an upper surface of the first gap-fill insulating layer 164 and filling an upper portion of the gate trench 130T.

Figure 15:
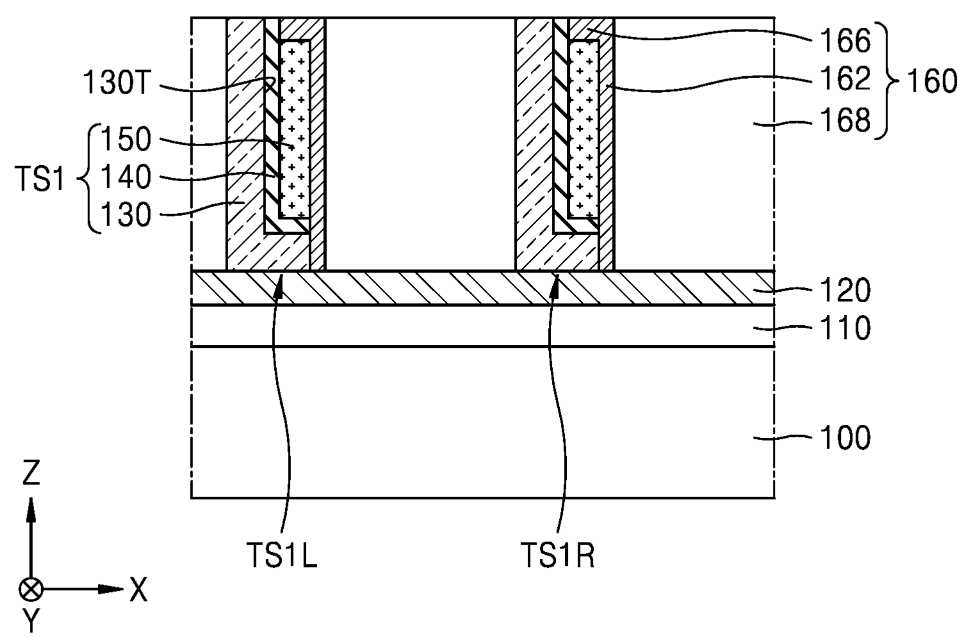

Referring to FIGS. 14A, 14B, and 15 together, one first channel layer 130, one first gate dielectric layer 140, and one first gate electrode 150 corresponding to each other among the pair of first channel layers 130, the pair of first gate dielectric layers 140, and the pair of first gate electrodes 150 in the gate trench 130T are removed, so that only the first channel layer 130 having an L-shaped vertical cross-section, the first gate dielectric layer 140 having an L-shaped vertical cross-section, and the first gate electrode 150 having an I-shaped vertical cross-section remain.

In some embodiments, a portion of the first barrier insulating layer 161 covering the upper surface of the conductive line 120 may be removed to form a first vertical cover insulating layer 162, and at least a portion of the first gap-fill insulating layer 164 may be removed.

Thereafter, a first filling insulating layer 168 may be formed on and to cover the conductive line 120 and to have an upper surface at the same vertical level as the upper surface of the first horizontal cover insulating layer 166. In some embodiments, a portion of the first filling insulating layer 168 may be at least a portion of the first gap-fill insulating layer 164. A plurality of first vertical cover insulating layers 162, a plurality of first horizontal cover insulating layers 166, and the first filling insulating layer 168 may be collectively referred to as a first interlayer insulating layer 160. That is, the first interlayer insulating layer 160 may include a plurality of first vertical cover insulating layers 162, a plurality of first horizontal cover insulating layers 166, and the first filling insulating layer 168.

Among a plurality of first vertical transistor structures TS1, a pair of first vertical transistor structures TS1 adjacent to each other in the first horizontal direction (X-direction) and respectively remaining in a pair of gate trenches 130T adjacent to each other may be referred to as a first left vertical transistor structure TS1L and a first right vertical transistor structure TS1R, respectively.

Figure 16:
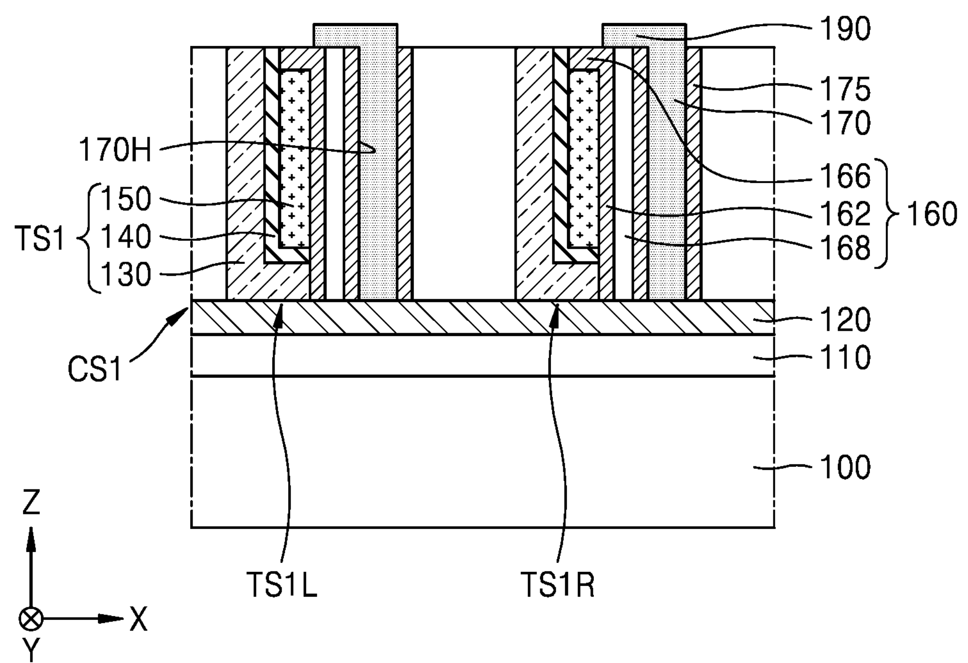

Referring to FIG. 16, a plurality of first contact holes 170H are formed to pass through the first interlayer insulating layer 160 to expose the conductive line 120 on lower surfaces thereof. For example, the plurality of first contact holes 170H may be formed to pass through the first filling insulating layer 168 and expose the conductive line 120 on the lower surfaces thereof. Each of the plurality of first contact holes 170H may be formed adjacent to each of the plurality of first vertical transistor structures TS1 but apart from each other. For example, each of the plurality of first contact holes 170H may be formed adjacent to each of the plurality of first vertical transistor structures TS1 in the first horizontal direction (X direction).

Thereafter, a plurality of first side surface insulating layers 175 are formed on and to cover inner side surfaces of the plurality of first contact holes 170H, and then, a plurality of first connection contacts 170 are formed to fill the plurality of first contact holes 170H. Each of the plurality of first side surface insulating layers 175 may be formed to have a hollow cylindrical shape, and each of the plurality of first connection contacts 170 may be formed to fill the cylindrical shape of each of the plurality of first side surface insulating layers 175. The plurality of first side surface insulating layers 175 may be between the plurality of first connection contacts 170 and the first interlayer insulating layer 160. For example, the plurality of first side surface insulating layers 175 may be between the plurality of first connection contacts 170 and the first filling insulating layer 168.

A plurality of first connection pads 190 are formed on the plurality of first connection contacts 170. The plurality of first connection contacts 170 may electrically connect the plurality of first connection pads 190 and the plurality of conductive lines 120 to each other. In some embodiments, the plurality of first connection pads 190 may be formed at a higher vertical level than a plurality of first gate dielectric layers 140. For example, upper surfaces of the plurality of first connection pads 190 may be at a higher vertical level than upper surfaces of the plurality of first gate dielectric layers 140. In some embodiments, lower surfaces of the plurality of first connection pads 190 may be formed at the same vertical level as an upper surface of the first filling insulating layer 168.

In some embodiments, the upper surfaces of the plurality of first gate dielectric layers 140, upper surfaces of the plurality of first horizontal cover insulating layers 166, the upper surface of the first filling insulating layer 168, and upper surfaces of the plurality of first side surface insulating layers 175 may be coplanar with each other. For example, the lower surfaces of the plurality of first connection pads 190 may be at the same vertical level as the upper surfaces of the plurality of first gate dielectric layers 140, the upper surfaces of the plurality of first horizontal cover insulating layers 166, the upper surface of the first filling insulating layer 168, and the upper surfaces of the plurality of first side surface insulating layers 175.

Figure 17:
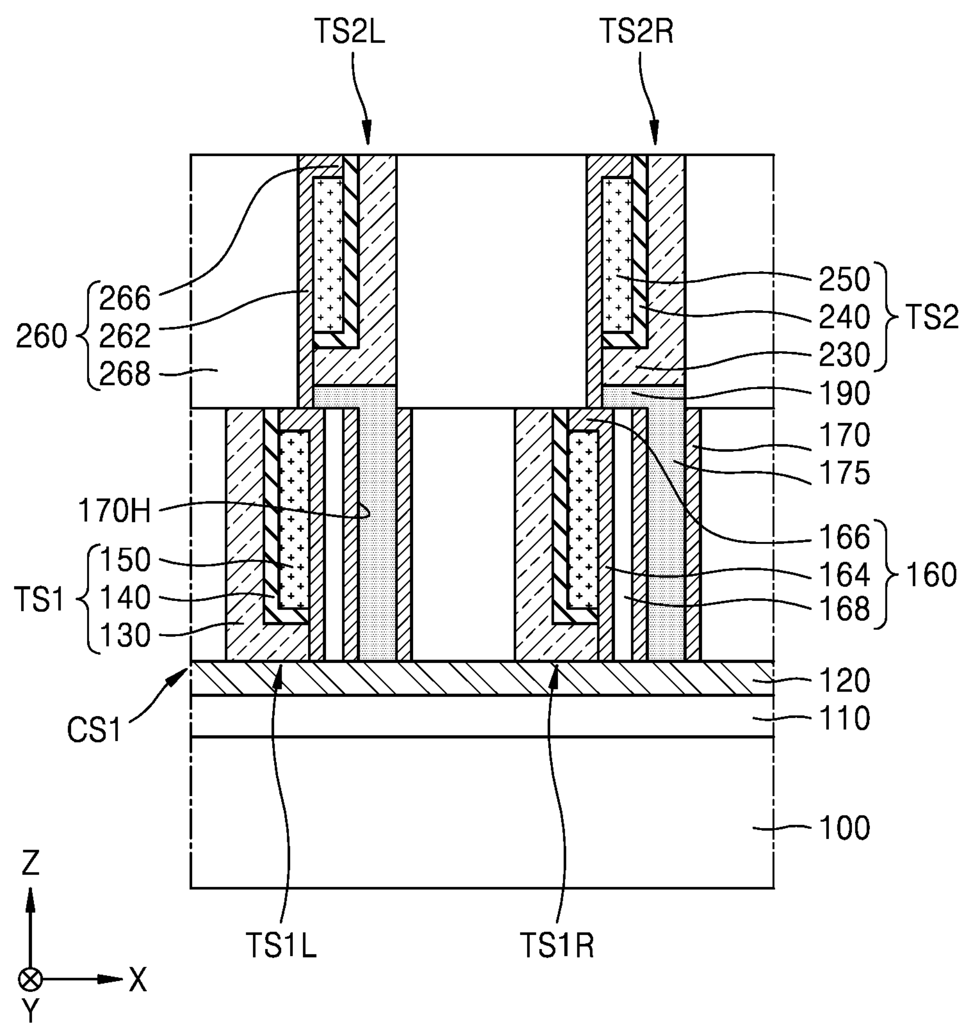

Referring to FIG. 17, a plurality of second vertical transistor structures TS2 and a second interlayer insulating layer 260 are formed on a first cell stack CST, the plurality of second vertical transistor structures TS2 each including a second channel layer 230, a second gate electrode 250, and a second gate dielectric layer 240 between the second channel layer 230 and the second gate electrode 250, and the second interlayer insulating layer 260 surrounding the plurality of second vertical transistor structures TS2 and including a plurality of second vertical cover insulating layers 262, a plurality of second horizontal cover insulating layers 266, and a second filling insulating layer 268.

The plurality of second vertical transistor structures TS2 and the second interlayer insulating layer 260 may be formed in a manner similar to the method of manufacturing the plurality of first vertical transistor structures TS1 and the first interlayer insulating layer 160 described with reference to FIGS. 4A to 15.

Figure 18:
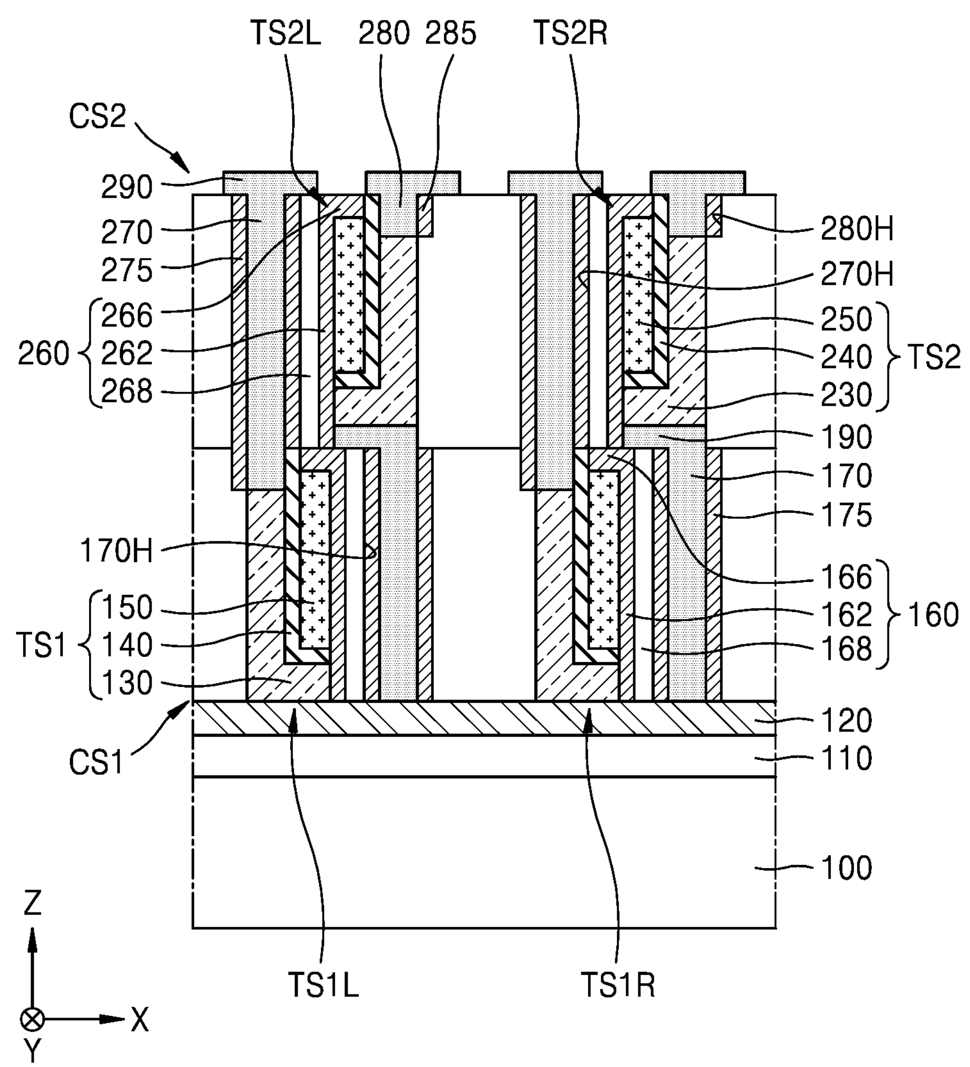

Referring to FIG. 18, a plurality of second contact holes 270H are formed to pass through the second interlayer insulating layer 260 to expose the plurality of first channel layers 130 on lower surfaces thereof. For example, the plurality of second contact holes 270H may be formed to pass through the second filling insulating layer 268 to expose the plurality of first channel layers 130 on the lower surfaces thereof. Each of the plurality of second contact holes 270H may be formed adjacent to each of the plurality of second vertical transistor structures TS2 but apart from each other. For example, each of the plurality of second contact holes 270H may be formed adjacent to each of the plurality of second vertical transistor structures TS2 in a direction opposite to the first horizontal direction (X direction).

In some embodiments, the plurality of second contact holes 270H may be formed to pass through the second filling insulating layer 268 and extend into the first filling insulating layer 168 such that, in the process of forming the plurality of second contact holes 270H, upper portions of the plurality of first channel layers 130 may also be removed. In some embodiments, an uppermost end of each of the plurality of first channel layers 130 may be at a lower vertical level than an uppermost end of each of the plurality of first gate electrodes 150.

Thereafter, a plurality of second side surface insulating layers 275 are formed on and to cover inner side surfaces of the plurality of second contact holes 270H, and then, a plurality of second connection contacts 270 are formed to fill the plurality of second contact holes 270H. Each of the plurality of second side surface insulating layers 275 may be formed to have a hollow cylindrical shape, and each of the plurality of second connection contacts 270 may be formed to fill the cylindrical shape of each of the plurality of second side surface insulating layers 275. The plurality of second side surface insulating layers 275 may be between the plurality of second connection contacts 270 and the second interlayer insulating layer 260. For example, the plurality of second side surface insulating layers 275 may be between the plurality of second connection contacts 270 and the second filling insulating layer 268.

In some embodiments, after removing upper portions of the plurality of second channel layers 230, a plurality of third side surface insulating layers 285 and a plurality of third connection contacts 280 may be formed. The plurality of third connection contacts 280 may be formed to pass through an upper portion of the second interlayer insulating layer 260 from an upper surface of the second interlayer insulating layer 260 such that lower surfaces thereof may be connected to the plurality of second channel layers 230. Each of the plurality of third side surface insulating layers 285 may have a hollow cylindrical shape, and each of the plurality of third connection contacts 280 may fill the cylindrical shape of each of the plurality of third side surface insulating layers 285.

A plurality of second connection pads 290 are formed on the plurality of second connection contacts 270 and the plurality of third connection contacts 280. The plurality of second connection contacts 270 may electrically connect some of the plurality of second connection pads 290 and the plurality of first channel layers 130 to each other, and the plurality of third connection contacts 280 may electrically connect some other ones of the plurality of second connection pads 290 and the plurality of second channel layers 230 to each other. In some embodiments, the plurality of second connection pads 290 may be formed at a higher vertical level than a plurality of second gate dielectric layers 240. For example, upper surfaces of the plurality of second connection pads 290 may be at a higher vertical level than upper surfaces of the plurality of second gate dielectric layers 240. In some embodiments, lower surfaces of the plurality of second connection pads 290 may be formed at the same vertical level as an upper surface of the second filling insulating layer 268.

In some embodiments, the upper surfaces of the plurality of second gate dielectric layers 240, upper surfaces of the plurality of second horizontal cover insulating layers 266, the upper surface of the second filling insulating layer 268, upper surfaces of the plurality of second side surface insulating layers 275, and upper surfaces of the plurality of third side surface insulating layers 285 may be coplanar with each other. For example, the lower surfaces of the plurality of second connection pads 290 may be at the same vertical level as the upper surfaces of the plurality of second gate dielectric layers 240, the upper surfaces of the plurality of second horizontal cover insulating layers 266, the upper surface of the second filling insulating layer 268, the upper surfaces of the plurality of second side surface insulating layers 275, and the upper surfaces of the plurality of third side surface insulating layers 285.

Thereafter, as shown in FIG. 1, a supporting insulating layer 400 surrounding the plurality of second connection pads 290, and a plurality of capacitor structures 500 arranged on the plurality of second connection pads 290 are formed, thereby forming the semiconductor memory device 1.

Figure 19:
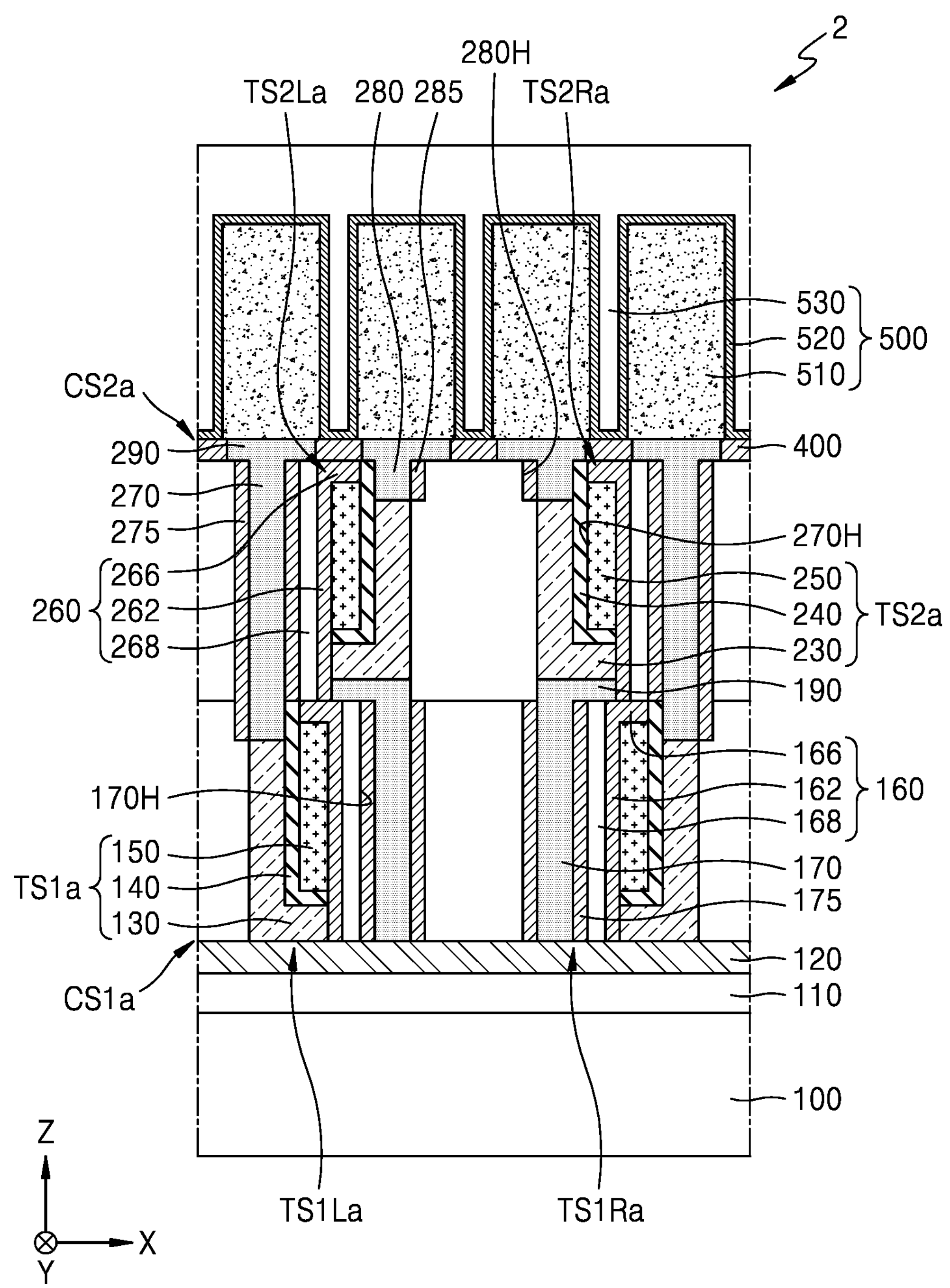
FIG. 19 is a cross-sectional view illustrating a semiconductor memory device according to embodiments.
Figure 20A:
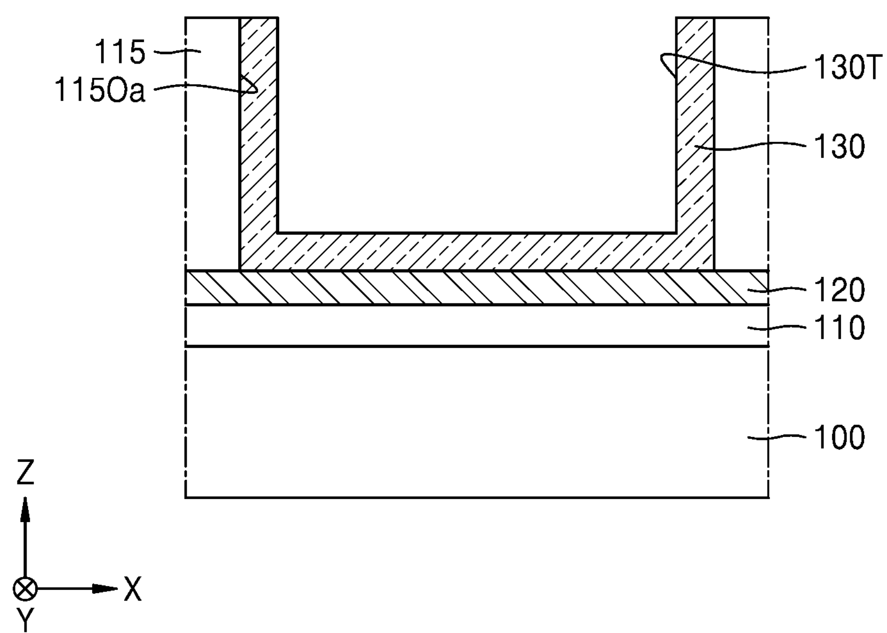
FIGS. 20A and 20B are cross-sectional views illustrating a method of manufacturing a semiconductor memory device, according to embodiments.
Figure 20B:
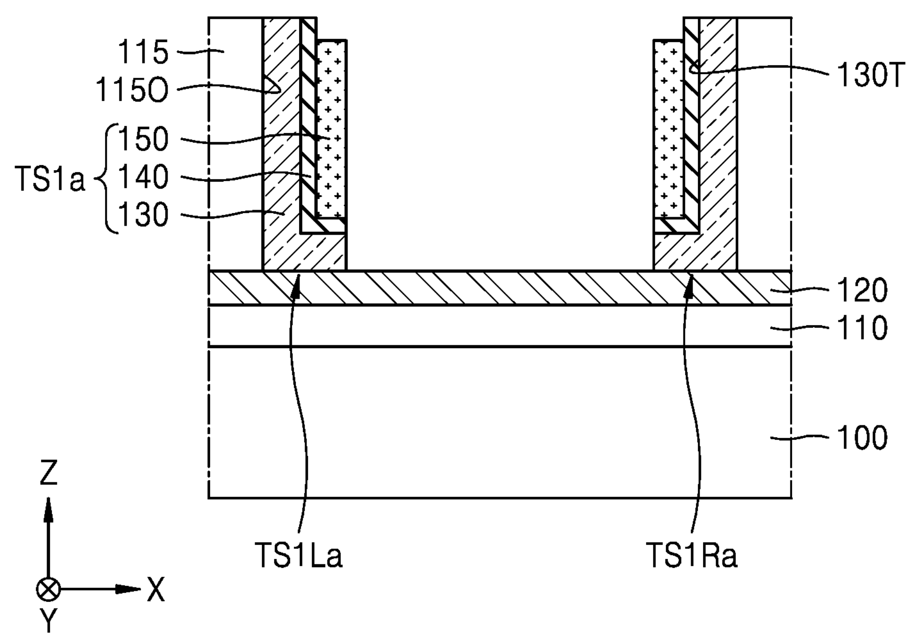

FIG. 19 is a cross-sectional view illustrating a semiconductor memory device 2 according to an embodiment, and FIGS. 20A and 20B are cross-sectional views illustrating a method of manufacturing the semiconductor memory device 2, according to an embodiment. In detail, FIGS. 19, 20A, and 20B are cross-sectional views illustrating a X-Z plane. In FIGS. 19, 20A, and 20B, the same reference numerals as those of FIGS. 1 to 18 denote the same members, and descriptions overlapping those of FIGS. 1 to 18 may be omitted.

Referring to FIG. 19, the semiconductor memory device 2 according to example embodiments may include a substrate 100, an interline insulating layer 110, a plurality of conductive lines 120 on the interline insulating layer 110, a first cell stack CS1*a* on the interline insulating layer 110 and the conductive line 120, a second cell stack CS2*a* on the first cell stack CS1*a*, and a plurality of capacitor structures 500 on the second cell stack CS2*a*.

The semiconductor memory device 2 may include a plurality of vertical transistor structures and a plurality of connection contacts. A vertical transistor structures and a capacitor structure 500 may together constitute a memory cell. Accordingly, in an embodiment, the semiconductor memory device 2 may include a plurality of memory cells that are constituted by the plurality of vertical transistor structures and the plurality of capacitor structures 500. The plurality of vertical transistor structures and the plurality of connection contacts may be connected to each other, in pairs, in series between the conductive line 120 and a lower electrode 510. That is, one vertical transistor structure and one connection contact may be connected in series and a plurality of vertical transistor structures and connection contacts may be so connected. One or more of the plurality of vertical transistor structures and one or more of the plurality of connection contacts may be arranged in a vertical direction (Z direction) between the conductive line 120 and the lower electrode 510 such that at least portions thereof may overlap each other in the vertical direction (Z direction). The plurality of vertical transistor structures may include a plurality of first vertical transistor structures TS1*a* and a plurality of second vertical transistor structures TS2*a*. The plurality of connection contacts may include a plurality of first connection contacts 170 and a plurality of second connection contacts 270.

The first cell stack CS1*a* may include the plurality of first vertical transistor structures TS1*a* and the plurality of first connection contacts 170, and the second cell stack CS2*a* may include the plurality of second vertical transistor structures TS2*a* and the plurality of second connection contacts 270. The first vertical transistor structure TS1*a* and the second connection contact 270, or the first connection contact 170 and the second vertical transistor structure TS2*a* may be between the conductive line 120 and the capacitor structure 500. Some of the plurality of capacitor structures 500 may each be connected to one of the plurality of conductive lines 120 through the first vertical transistor structure TS1*a* and the second connection contact 270, and some other ones of the plurality of capacitor structures 500 may each be connected to one of the plurality of conductive lines 120 through the first connection contact 170 and the second vertical transistor structure TS2*a*.

The first vertical transistor structure TS1*a* may include a first channel layer 130, a first gate electrode 150, and a first gate dielectric layer 140 between the first channel layer 130 and the first gate electrode 150. The second vertical transistor structure TS2*a* may include a second channel layer 230, a second gate electrode 250, and a second gate dielectric layer 240 between the second channel layer 230 and the second gate electrode 250.

Among the plurality of first vertical transistor structures TS1*a*, a pair of first vertical transistor structures TS1*a* adjacent to each other in a first horizontal direction (X direction) may be referred to as a first left vertical transistor structure TS1La and a first right vertical transistor structure TS1Ra, respectively. The first left vertical transistor structure TS1La and the first right vertical transistor structure TS1Ra may have substantially mirror-symmetric vertical cross-sections in the first horizontal direction (X direction) with respect to the vertical direction (Z direction). The first channel layer 130 and the first gate dielectric layer 140 included in the first left vertical transistor structure TS1La may each have an L-shaped vertical cross-section, and the first channel layer 130 and the first gate dielectric layer 140 included in the first right vertical transistor structure TS1Ra may each have an inverted L-shaped vertical cross-section. The first connection contact 170 corresponding to the first left vertical transistor structure TS1La may be arranged adjacent to the first left vertical transistor structure TS1La in the first horizontal direction (X direction), and the first connection contact 170 corresponding to the first right vertical transistor structure TS1Ra may be arranged adjacent to the first right vertical transistor structure TS1Ra in a direction opposite to the first horizontal direction (X direction).

Among the plurality of second vertical transistor structures TS2*a*, a pair of second vertical transistor structures TS2*a* adjacent to each other in the first horizontal direction (X direction) may be referred to as a second left vertical transistor structure TS2La and a second right vertical transistor structure TS2Ra, respectively. The second left vertical transistor structure TS2La and the second right vertical transistor structure TS2Ra may have substantially mirror-symmetric vertical cross-sections in the first horizontal direction (X direction) with respect to the vertical direction (Z direction). The second channel layer 230 and the second gate dielectric layer 240 included in the second left vertical transistor structure TS2La may each have an inverted L-shaped vertical cross-section, and the second channel layer 230 and the second gate dielectric layer 240 included in the second right vertical transistor structure TS2Ra may each have an L-shaped vertical cross-section.

The second connection contact 270 corresponding to the second left vertical transistor structure TS2La may be arranged adjacent to the second left vertical transistor structure TS2La in the direction opposite to the first horizontal direction (X direction), and the second connection contact 270 corresponding to the second right vertical transistor structure TS2Ra may be arranged adjacent to the second right vertical transistor structure TS2Ra in the first horizontal direction (X direction). The second left vertical transistor structure TS2La and the second connection contact 270 corresponding thereto may be arranged on the first left vertical transistor structure TS1La and the first connection contact 170 corresponding thereto, and the second right vertical transistor structure TS2Ra and the second connection contact 270 corresponding thereto may be arranged on the first right vertical transistor structure TS1Ra and the first connection contact 170 corresponding thereto.

For example, a pair of first connection contacts 170 connected to a pair of second vertical transistor structures TS2*a*, that is, the second left vertical transistor structure TS2La and the second right vertical transistor structure TS2Ra, may be arranged between a pair of first vertical transistor structures TS1*a*, that is, the first left vertical transistor structure TS1La and the first right vertical transistor structure TS1Ra. For example, a pair of second vertical transistor structures TS2*a*, that is, the second left vertical transistor structure TS2La and the second right vertical transistor structure TS2Ra, connected to a pair of first connection contacts 170 may be arranged between a pair of second connection contacts 270 connected to a pair of first vertical transistor structures TS1*a*, that is, the first left vertical transistor structure TS1La and the first right vertical transistor structure TS1Ra.

Referring to FIG. 20A, a plurality of first channel layers 130 are formed to each have a gate trench 130T defined therein and a U-shaped vertical cross-section. The gate trench 130T may be defined inside each of the plurality of first channel layers 130 having a U-shaped vertical cross-section. The plurality of first channel layers 130 may be formed as described with reference to FIGS. 2A to 11B, and a plurality of isolation insulating layers 115 may be formed to have a channel trench 1150*a* having a greater horizontal width than the channel trench 1150 shown in FIG. 5A in the first horizontal direction (X direction).

Referring to FIGS. 20A and 20B together with FIGS. 12A to 13B, a first preliminary gate dielectric layer 140P and a first preliminary gate electrode 150P are sequentially formed on and to cover an inner side surface and a lower surface of the gate trench 130T, and portions of the first preliminary gate dielectric layer 140P and portions of the first preliminary gate electrode 150P that cover upper surfaces of the plurality of isolation insulating layers 115, upper surfaces of uppermost ends of the plurality of first channel layers 130, and portions of lower surfaces of a plurality of gate trenches 130T are removed to form a first gate dielectric layer 140 and a first gate electrode 150. After removing a portion of the first preliminary gate dielectric layer 140P and a portion of first preliminary gate electrode 150P that cover a portion of the lower surface of the gate trench 130T, a portion of an upper surface of the conductive line 120 may be exposed by removing a portion of the first channel layer 130 that is exposed on the lower surface of the gate trench 130T, and each of the plurality of first channel layers 130 having a U-shaped vertical cross-section may be separated into a pair of first channel layers 130 respectively having an L-shaped vertical cross-section and an inverted L-shaped vertical cross-section. A pair of first gate dielectric layers 140 may be formed to respectively have an L-shaped vertical cross-section and an inverted L-shaped vertical cross-section that cover side surfaces and upper surfaces of the pair of first channel layers 130 in the gate trench 130T, and a pair of first gate electrodes 150 may be formed to each have an I-shaped vertical cross section covering the pair of first gate dielectric layers 140 in the gate trench 130T and extending in the vertical direction (Z direction).

A pair of first vertical transistor structures TS1*a* may be arranged in one gate trench 130T, and the pair of first vertical transistor structures TS1*a* may include a first left vertical transistor structure TS1La and a first right vertical transistor structure TS1Ra. Thereafter, the semiconductor memory device 2 shown in FIG. 19 may be formed as described with reference to FIGS. 16 to 18, without removing one of the pair of first vertical transistor structures TS1*a* in the one gate trench 130T.

Figure 21:
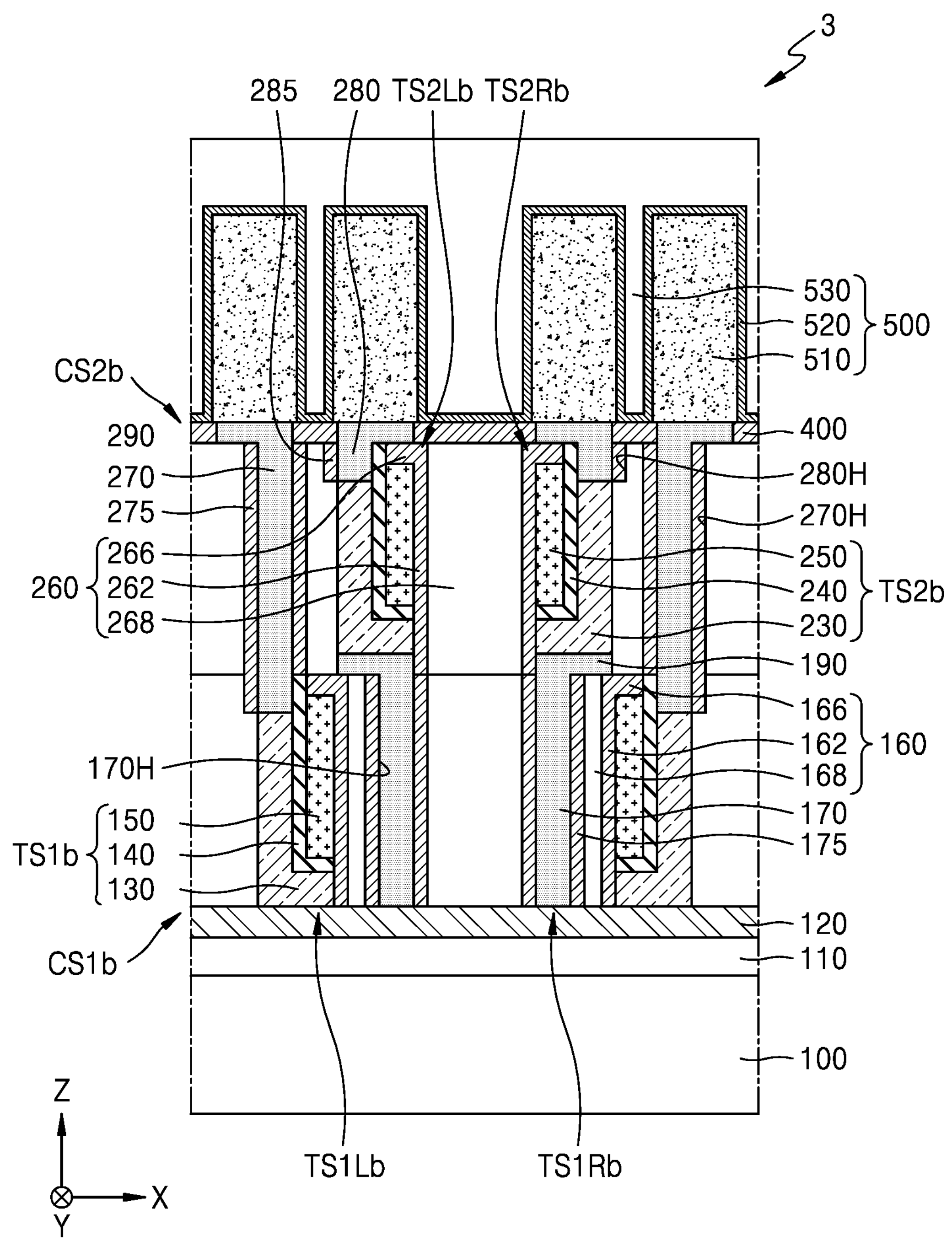
FIG. 21 is a cross-sectional view illustrating a semiconductor memory device according to embodiments.

FIG. 21 is a cross-sectional view illustrating a semiconductor memory device 3 according to embodiments. In FIG. 21, the same reference numerals as those of FIGS. 1 to 20B denote the same members, and descriptions overlapping those of FIGS. 1 to 20B may be omitted.

Referring to FIG. 21, the semiconductor memory device 3 according to example embodiments may include a substrate 100, an interline insulating layer 110, a plurality of conductive lines 120 on the interline insulating layer 110, a first cell stack CS1*b* on the interline insulating layer 110 and the conductive line 120, a second cell stack CS2*b* on the first cell stack CS1*b*, and a plurality of capacitor structures 500 on the second cell stack CS2*b*.

The semiconductor memory device 3 may include a plurality of vertical transistor structures and a plurality of connection contacts. One of the plurality of vertical transistor structures and one of the plurality of capacitor structures 500 may constitute a memory cell, and thus, the semiconductor memory device 3 may include a plurality of memory cells that are constituted by the plurality of vertical transistor structures and the plurality of capacitor structures 500. One of the plurality of vertical transistor structures and one of the plurality of connection contacts may be connected to each other in series between the conductive line 120 and a lower electrode 510. One of the plurality of vertical transistor structures and one of the plurality of connection contacts may be arranged in a vertical direction (Z direction) between the conductive line 120 and the lower electrode 510 such that at least portions thereof may overlap each other in the vertical direction (Z direction). The plurality of vertical transistor structures may include a plurality of first vertical transistor structures TS1*b* and a plurality of second vertical transistor structures TS2*b*. The plurality of connection contacts may include a plurality of first connection contacts 170 and a plurality of second connection contacts 270.

The first cell stack CS1*b* may include the plurality of first vertical transistor structures TS1*b* and the plurality of first connection contacts 170, and the second cell stack CS2*b* may include the plurality of second vertical transistor structures TS2*b* and the plurality of second connection contacts 270. The first vertical transistor structure TS1*b* and the second connection contact 270, or the first connection contact 170 and the second vertical transistor structure TS2*b* may be between the conductive line 120 and the capacitor structure 500. Some of the plurality of capacitor structures 500 may be connected to one of the plurality of conductive lines 120 through the first vertical transistor structure TS1*b* and the second connection contact 270, and some other ones of the plurality of capacitor structures 500 may be connected to one of the plurality of conductive lines 120 through the first connection contact 170 and the second vertical transistor structure TS2*b*.

The first vertical transistor structure TS1*b* may include a first channel layer 130, a first gate electrode 150, and a first gate dielectric layer 140 between the first channel layer 130 and the first gate electrode 150. The second vertical transistor structure TS2*b* may include a second channel layer 230, a second gate electrode 250, and a second gate dielectric layer 240 between the second channel layer 230 and the second gate electrode 250.

Among the plurality of first vertical transistor structures TS1*b*, a pair of first vertical transistor structures TS1*b* adjacent to each other in a first horizontal direction (X direction) may be referred to as a first left vertical transistor structure TS1Lb and a first right vertical transistor structure TS1Rb, respectively. The first left vertical transistor structure TS1Lb and the first right vertical transistor structure TS1Rb may have substantially mirror-symmetric vertical cross-sections in the first horizontal direction (X direction) with respect to the vertical direction (Z direction). The first channel layer 130 and the first gate dielectric layer 140 included in the first left vertical transistor structure TS1Lb may each have an L-shaped vertical cross-section, and the first channel layer 130 and the first gate dielectric layer 140 included in the first right vertical transistor structure TS1Rb may each have an inverted L-shaped vertical cross-section. The first connection contact 170 corresponding to the first left vertical transistor structure TS1Lb may be adjacent to the first left vertical transistor structure TS1Lb in the first horizontal direction (X direction), and the first connection contact 170 corresponding to the first right vertical transistor structure TS1Rb may be adjacent to the first right vertical transistor structure TS1Rb in a direction opposite to the first horizontal direction (X direction).

Among the plurality of second vertical transistor structures TS2*b*, a pair of second vertical transistor structures TS2*b* adjacent to each other in the first horizontal direction (X direction) may be referred to as a second left vertical transistor structure TS2Lb and a second right vertical transistor structure TS2Rb, respectively. The second left vertical transistor structure TS2Lb and the second right vertical transistor structure TS2Rb may have substantially mirror-symmetric vertical cross-sections in the first horizontal direction (X direction) with respect to the vertical direction (Z direction). The second channel layer 230 and the second gate dielectric layer 240 included in the second left vertical transistor structure TS2Lb may each have an L-shaped vertical cross-section, and the second channel layer 230 and the second gate dielectric layer 240 included in the second right vertical transistor structure TS2Rb may each have an inverted L-shaped vertical cross-section. The second connection contact 270 corresponding to the second left vertical transistor structure TS2Lb may be arranged adjacent to the second left vertical transistor structure TS2Lb in the direction opposite to the first horizontal direction (X direction), and the second connection contact 270 corresponding to the second right vertical transistor structure TS2Rb may be arranged adjacent to the second right vertical transistor structure TS2Rb in the first horizontal direction (X direction). The second left vertical transistor structure TS2Lb and the second connection contact 270 corresponding thereto may be arranged on the first left vertical transistor structure TS1Lb and the first connection contact 170 corresponding thereto, and the second right vertical transistor structure TS2Rb and the second connection contact 270 corresponding thereto may be arranged on the first right vertical transistor structure TS1Rb and the first connection contact 170 corresponding thereto.

The first channel layer 130 and the first gate dielectric layer 140 included in the first left vertical transistor structure TS1Lb and the second channel layer 230 and the second gate dielectric layer 240 included in the second left vertical transistor structure TS2Lb may have substantially the same vertical cross-section, for example, an L-shaped vertical cross-section. The first channel layer 130 and the first gate dielectric layer 140 included in the first right vertical transistor structure TS1Rb and the second channel layer 230 and the second gate dielectric layer 240 included in the second right vertical transistor structure TS2Rb may have substantially the same vertical cross-section, for example, an inverted L-shaped vertical cross-section.

In FIG. 21, first horizontal portions of each of the first left vertical transistor structure TS1Lb and the first right vertical transistor structure TS1Rb are closer to each other than first vertical portions thereof, and second horizontal portions of each of the second left vertical transistor structure TS2Lb and the second right vertical transistor structure TS2Rb are closer to each other than second vertical portions thereof, but embodiments are not limited thereto. For example, the first vertical portions of each of the first left vertical transistor structure TS1Lb and the first right vertical transistor structure TS1Rb may be closer to each other than the first horizontal portions thereof, and the second vertical portions of each of the second left vertical transistor structure TS2Lb and the second right vertical transistor structure TS2Rb may be closer to each other than the second horizontal portions thereof.

Figure 22:
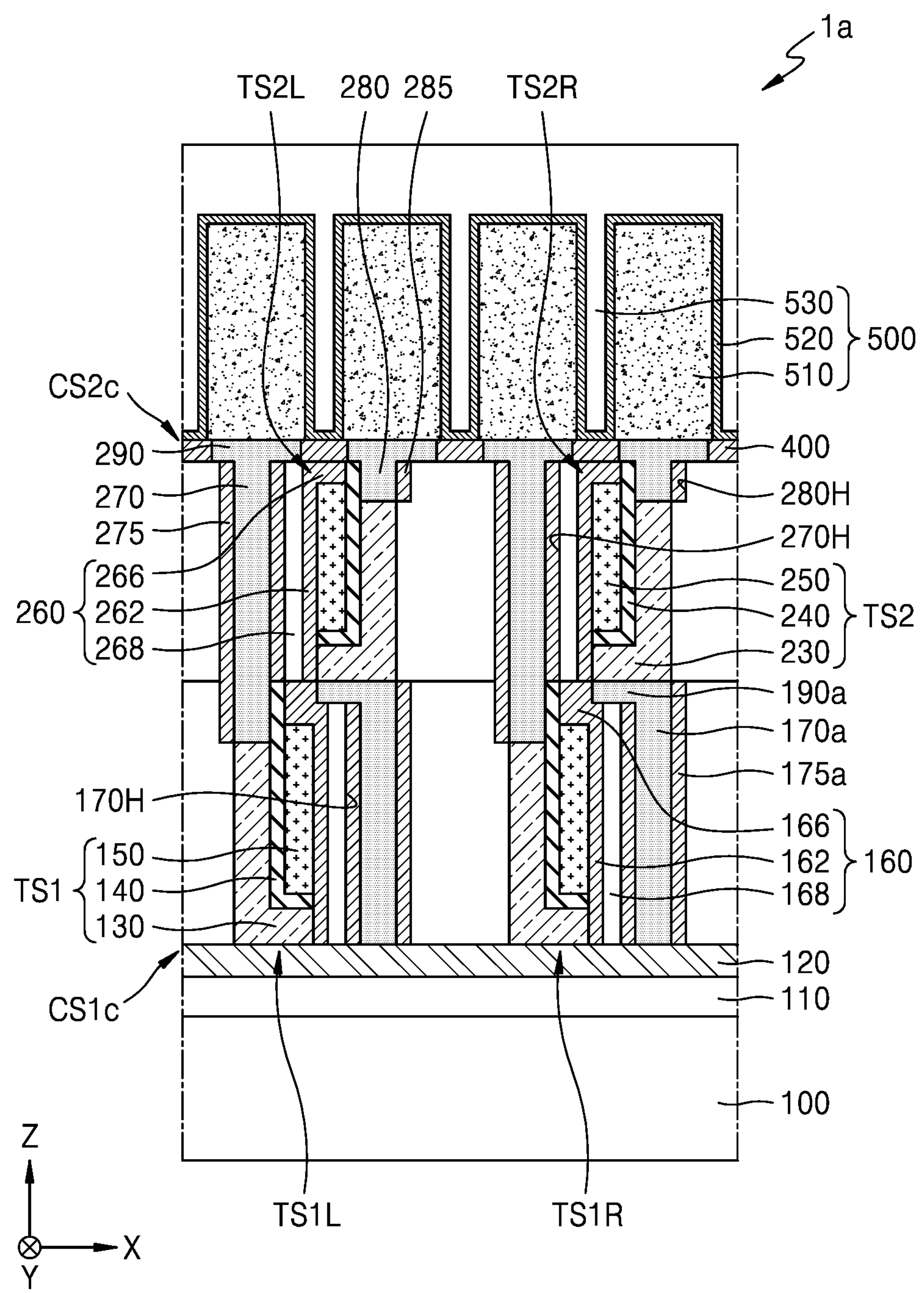
FIG. 22 is a cross-sectional view illustrating a semiconductor memory device according to embodiments.

FIG. 22 is a cross-sectional view illustrating a semiconductor memory device 1*a* according to embodiments. In FIG. 22, the same reference numerals as those of FIGS. 1 to 21 denote the same members, and descriptions overlapping those of FIGS. 1 to 21 may be omitted.

Referring to FIG. 22, the semiconductor memory device 1*a* according to example embodiments may include a substrate 100, an interline insulating layer 110, a plurality of conductive lines 120 on the interline insulating layer 110, a first cell stack CS1*c* on the interline insulating layer 110 and the conductive line 120, a second cell stack CS2*c* on the first cell stack CS1*c*, and a plurality of capacitor structures 500 on the second cell stack CS2*c*.

The first cell stack CS1*c* may include a plurality of first connection pads 190*a* arranged on a plurality of first connection contacts 170*a*. The plurality of first connection contacts 170*a* may electrically connect the plurality of first connection pads 190*a* and the plurality of conductive lines 120 to each other. A plurality of first side surface insulating layers 175*a* may be between the plurality of first connection contacts 170*a* and a first interlayer insulating layer 160. In some embodiments, the plurality of first side surface insulating layers 175*a* may be disposed on and cover at least portions of side surfaces of the plurality of first connection pads 190*a*. A plurality of second channel layers 230 may be arranged on the plurality of first connection pads 190*a*.

Upper surfaces of the plurality of first connection pads 190*a* may be at the same vertical level as upper surfaces of a plurality of first gate dielectric layers 140. In some embodiments, the upper surfaces of the plurality of first gate dielectric layers 140, upper surfaces of a plurality of first horizontal cover insulating layers 166, an upper surface of a first filling insulating layer 168, upper surfaces of the plurality of first side surface insulating layers 175*a*, and the upper surfaces of the plurality of first connection pads 190*a* may be coplanar with each other.

Figure 23:
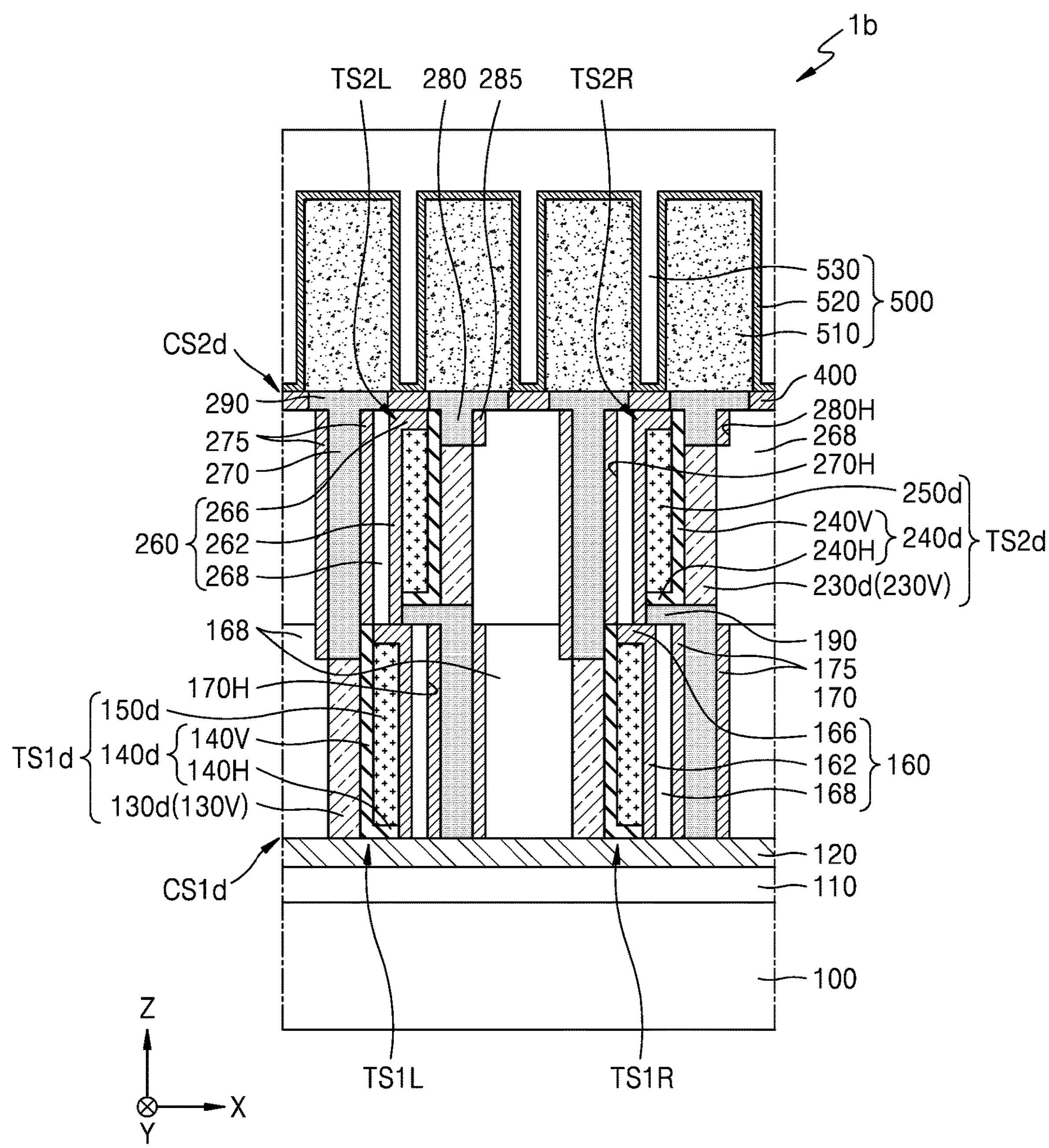
FIG. 23 is a cross-sectional view illustrating a semiconductor memory device according to embodiments.

FIG. 23 is a cross-sectional view illustrating a semiconductor memory device 1*b* according to embodiments. In FIG. 23, the same reference numerals as those of FIGS. 1 to 18 denote the same members, and descriptions overlapping those of FIGS. 1 to 18 may be omitted.

Referring to FIG. 23, the semiconductor memory device 1*b* according to example embodiments may include a substrate 100, an interline insulating layer 110, a plurality of conductive lines 120 on the interline insulating layer 110, a first cell stack CS1*d* on the interline insulating layer 110 and the conductive line 120, a second cell stack CS2*d* on the first cell stack CS1*d*, and a plurality of capacitor structures 500 on the second cell stack CS2*d*.

The semiconductor memory device 1*b* may include a plurality of vertical transistor structures and a plurality of connection contacts. One of the plurality of vertical transistor structures and one of the plurality of capacitor structures 500 may constitute a memory cell, and thus, the semiconductor memory device 1*b* may include a plurality of memory cells that are constituted by the plurality of vertical transistor structures and the plurality of capacitor structures 500. One of the plurality of vertical transistor structures and one of the plurality of connection contacts may be connected to each other in series between the conductive line 120 and a lower electrode 510. One of the plurality of vertical transistor structures and one of the plurality of connection contacts may be arranged in a vertical direction (Z direction) between the conductive line 120 and the lower electrode 510 such that at least portions thereof may overlap each other in the vertical direction (Z direction). The plurality of vertical transistor structures may include a plurality of first vertical transistor structures TS1*d* and a plurality of second vertical transistor structures TS2*d*. The plurality of connection contacts may include a plurality of first connection contacts 170 and a plurality of second connection contacts 270.

The first cell stack CS1*d* may include the plurality of first vertical transistor structures TS1*d* and the plurality of first connection contacts 170, and the second cell stack CS2*d* may include the plurality of second vertical transistor structures TS2*d* and the plurality of second connection contacts 270. The first vertical transistor structure TS1*d* and the second connection contact 270, or the first connection contact 170 and the second vertical transistor structure TS2*d* may be between the conductive line 120 and the capacitor structure 500. Some of the plurality of capacitor structures 500 may each be connected to one of the plurality of conductive lines 120 through the first vertical transistor structure TS1*d* and the second connection contact 270, and some other ones of the plurality of capacitor structures 500 may each be connected to one of the plurality of conductive lines 120 through the first connection contact 170 and the second vertical transistor structure TS2*d*.

The first vertical transistor structure TS1*d* may include a first channel layer 130*d*, a first gate electrode 150*d*, and a first gate dielectric layer 140*d* between the first channel layer 130*d* and the first gate electrode 150*d*. The second vertical transistor structure TS2*d* may include a second channel layer 230*d*, a second gate electrode 250*d*, and a second gate dielectric layer 240*d* between the second channel layer 230*d* and the second gate electrode 250*d*.

Each of a plurality of first channel layers 130*d* may have an I-shaped vertical cross-section. Each of a plurality of second channel layers 230*d* may have an I-shaped vertical cross-section. The first channel layer 130*d* may include only the first vertical portion 130V among the first vertical portion 130V and the first horizontal portion 130H included in the first channel layer 130 shown in FIG. 1, and the second channel layer 230*d* may include only the second vertical portion 230V among the second vertical portion 230V and the second horizontal portion 230H included in the second channel layer 230 shown in FIG. 1.

The first gate dielectric layer 140*d* may have an L-shaped vertical cross-section along a side surface of one first channel layer 130*d* having an I-shaped vertical cross-section and an upper surface of the conductive line 120. The first gate dielectric layer 140*d* may include a first insulating horizontal portion 140H and a first insulating vertical portion 140V, the first insulating horizontal portion 140H extending in a first horizontal direction (X direction) on the conductive line 120, and the first insulating vertical portion 140V extending from the first insulating horizontal portion 140H along the side surface of the first channel layer 130*d* in the vertical direction (Z direction). For example, the first insulating horizontal portion 140H of the first gate dielectric layer 140*d* may extend from the first insulating vertical portion 140V in the first horizontal direction (X direction).

The first gate electrode 150*d* may be formed on the first gate dielectric layer 140*d*. The first gate electrode 150*d* may extend in the vertical direction (Z direction) on and to cover the first gate dielectric layer 140*d*. The first gate electrode 150*d* may extend long in a second horizontal direction (Y direction). The first gate electrode 150*d* may be disposed on and cover an inner surface of the first gate dielectric layer 140*d* having an L-shaped vertical cross-section, and may have an I-shaped vertical cross-section. For example, the first gate electrode 150*d* may be disposed on and cover the first insulating horizontal portion 140H of the first gate dielectric layer 140*d*, and may extend in the vertical direction (Z direction) on and to cover the first insulating vertical portion 140V of the first gate dielectric layer 140*d*.

The second gate dielectric layer 240*d* may have an inverted L-shaped vertical cross-section along a side surface of one second channel layer 230*d* having an I-shaped vertical cross-section and an upper surface of a first connection pad 190. The second gate dielectric layer 240*d* may include a second insulating horizontal portion 240H and a second insulating vertical portion 240V, the second insulating horizontal portion 240H extending in the first horizontal direction (X direction) on the first connection pad 190, and the second insulating vertical portion 240V extending from the second insulating horizontal portion 240H along the side surface of the second channel layer 230*d* in the vertical direction (Z direction). For example, the second insulating horizontal portion 240H of the second gate dielectric layer 240*d* may extend from the second insulating vertical portion 240V in the first horizontal direction (X direction).

The second gate electrode 250*d* may be formed on the second gate dielectric layer 240*d*. The second gate electrode 250*d* may extend in the vertical direction (Z direction) on and to cover the second gate dielectric layer 240*d*. The second gate electrode 250*d* may extend long in the second horizontal direction (Y direction). The second gate electrode 250*d* may be disposed on and cover an inner surface of the second gate dielectric layer 240*d* having an inverted L-shaped vertical cross-section, and may have an I-shaped vertical cross-section. For example, the second gate electrode 250*d* may be disposed on and cover the second insulating horizontal portion 240H of the second gate dielectric layer 240*d*, and may extend in the vertical direction (Z direction) on and to cover the second insulating vertical portion 240V of the second gate dielectric layer 240*d*.

Figure 24:
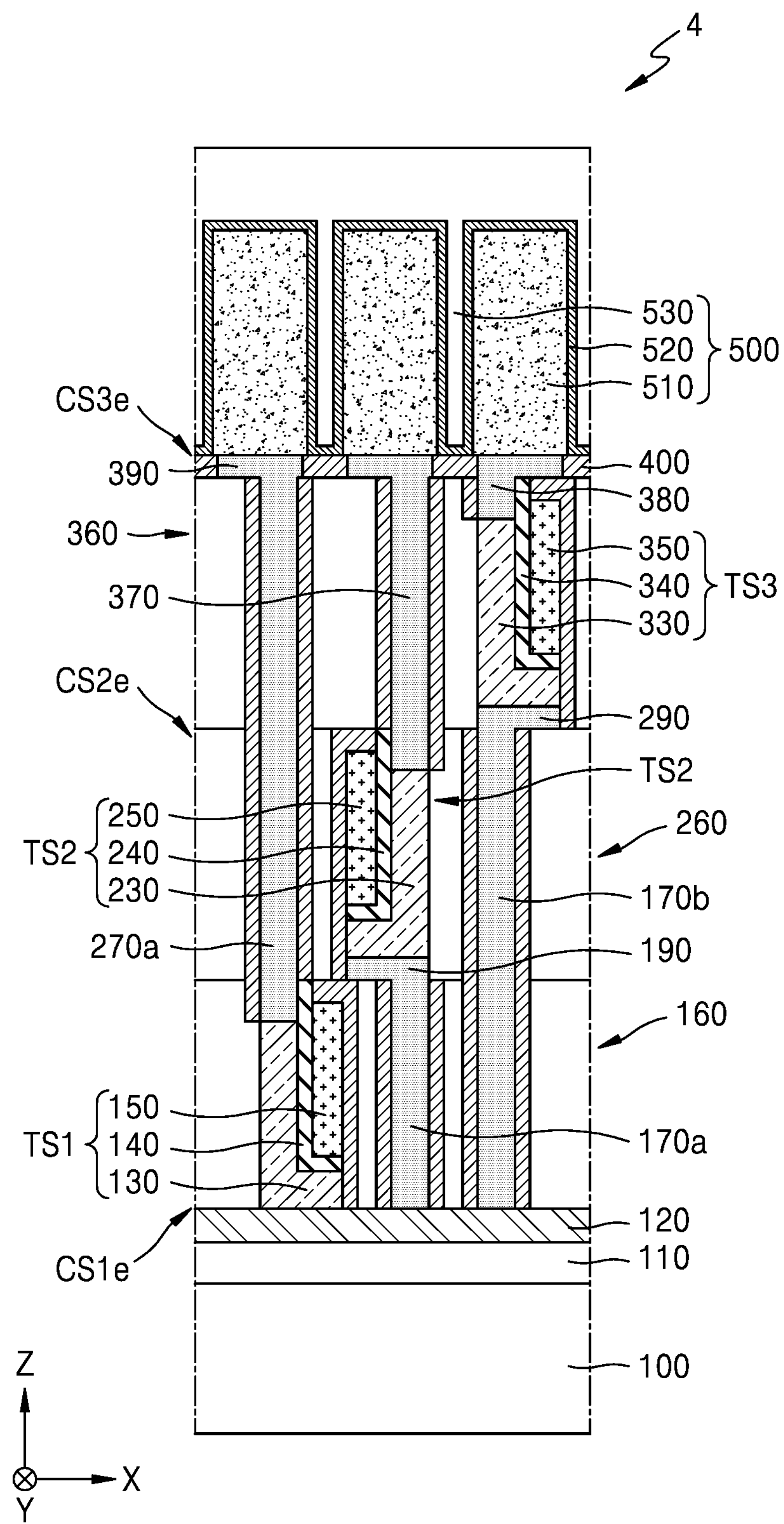
FIG. 24 is a cross-sectional view illustrating a semiconductor memory device according to embodiments.

FIG. 24 is a cross-sectional view illustrating a semiconductor memory device 4 according to embodiments. In FIG. 24, the same reference numerals as those of FIGS. 1 to 23 denote the same members, and descriptions overlapping those of FIGS. 1 to 23 may be omitted.

Referring to FIG. 24, the semiconductor memory device 4 according to example embodiments may include a substrate 100, an interline insulating layer 110, a plurality of conductive lines 120 on the interline insulating layer 110, a first cell stack CS1*e* on the interline insulating layer 110 and the conductive line 120, a second cell stack CS2*e* on the first cell stack CS1*e*, a third cell stack CS3*e* on the second cell stack CS2*e*, and a plurality of capacitor structures 500 on the third cell stack CS3*e*.

The first cell stack CS1*e* may include a plurality of first vertical transistor structures TS1, the second cell stack CS2*e* may include a plurality of second vertical transistor structures TS2, and the third cell stack CS3*e* may include a plurality of third vertical transistor structures TS3.

The first vertical transistor structure TS1 may include a first channel layer 130, a first gate electrode 150, and a first gate dielectric layer 140 between the first channel layer 130 and the first gate electrode 150. The second vertical transistor structure TS2 may include a second channel layer 230, a second gate electrode 250, and a second gate dielectric layer 240 between the second channel layer 230 and the second gate electrode 250. The third vertical transistor structure TS3 may include a third channel layer 330, a third gate electrode 350, and a third gate dielectric layer 340 between the third channel layer 330 and the third gate electrode 350.

The first channel layer 130 may be arranged on the conductive line 120, the second channel layer 230 may be arranged on a first connection pad 190, the third channel layer 330 may be arranged on a second connection pad 290, and a plurality of lower electrodes 510 may be arranged on a plurality of third connection pads 390.

A first connection contact 170*a* may electrically connect the conductive line 120 and the first connection pad 190 to each other. A second connection contact 270*a* may electrically connect the first channel layer 130 and the third connection pad 390 to each other. A third connection contact 370 may electrically connect the second channel layer 230 and the third connection pad 390 to each other. A fourth connection contact 170*b* may electrically connect the conductive line 120 and the second connection pad 290 to each other. A fifth connection contact 380 may electrically connect the third channel layer 330 and the third connection pad 390 to each other.

A first interlayer insulating layer 160 may surround the first vertical transistor structure TS1 and the first connection contact 170*a*, and may surround a lower portion of the fourth connection contact 170*b*. A second interlayer insulating layer 260 may surround the second vertical transistor structure TS2, and may surround a lower portion of the second connection contact 270*a* and an upper portion of the fourth connection contact 170*b*. A third interlayer insulating layer 360 may surround the third vertical transistor structure TS3, the third connection contact 370, and the fifth connection contact 380, and may surround an upper portion of the second connection contact 270*a*.

In FIG. 24, the first channel layer 130 and the first gate dielectric layer 140 included in the first vertical transistor structure TS1 each have an L-shaped vertical cross section, the second channel layer 230 and the second gate dielectric layer 240 included in the second vertical transistor structure TS2 each have an inverted L-shaped vertical cross section, and the third channel layer 330 and the third gate dielectric layer 340 included in the third vertical transistor structure TS3 each have an L-shaped vertical cross section, but embodiments are not limited thereto. Referring to FIGS. 1 to 23, shapes of the first vertical transistor structure TS1, the second vertical transistor structure TS2, and the third vertical transistor structure TS3 may be variously modified.

Also, in FIG. 24, the semiconductor memory device 4 includes three stacked cell stacks, that is, the first cell stack CS1*e*, the second cell stack CS2*e*, and the third cell stack CS3*e*, each including a plurality of vertical transistor structures. However, this is just an example, and embodiments are not limited thereto. For example, the semiconductor memory device 4 may include four or more stacked cell stacks each including a plurality of vertical transistor structures.

In some embodiments, when the semiconductor memory device 4 includes four or more stacked cell stacks, a shape of the first vertical transistor structure TS1 of a first layer and a shape of the third vertical transistor structure TS3 of a third layer may be substantially the same, a shape of the second vertical transistor structure TS2 of a second layer and a shape of a fourth vertical transistor structure of a fourth layer may be substantially the same. For example, when the semiconductor memory device 4 includes a plurality of stacked cell stacks, shapes of vertical transistor structures of odd-numbered layers may be substantially the same, and shapes of vertical transistor structures of even-numbered layers may be substantially the same.

While the inventive concept has been particularly shown and described with, it will be understood that various changes in form and details may be made therein without departing from the spirit and scope of the following claims.

What is claimed is:

1. A semiconductor memory device comprising:

a substrate;

a plurality of conductive lines extending in a first horizontal direction on the substrate and spaced apart from each other in a second horizontal direction perpendicular to the first horizontal direction;

a first cell stack on each of the plurality of conductive lines and comprising a plurality of first vertical transistor structures and a plurality of first connection contacts;

a second cell stack on the first cell stack and comprising a plurality of second vertical transistor structures and a plurality of second connection contacts; and a plurality of capacitor structures on the second cell stack and connected to the plurality of first vertical transistor structures and the plurality of second vertical transistor structures, wherein each of the plurality of first connection contacts is adjacent to one of the plurality of first vertical transistor structures and under one of the plurality of second vertical transistor structures, and electrically connects one of the plurality of conductive lines to one of the plurality of second vertical transistor structures, and wherein each of the plurality of second connection contacts is adjacent to one of the plurality of second vertical transistor structures and on one of the plurality of first vertical transistor structures, and electrically connects one of the plurality of first vertical transistor structures to one of the plurality of capacitor structures.

2. The semiconductor memory device of claim 1, wherein each of the plurality of first vertical transistor structures comprises a first channel layer having at least a portion extending in a vertical direction, a first gate electrode, and a first gate dielectric layer between the first channel layer and the first gate electrode, wherein each of the plurality of second vertical transistor structures comprises a second channel layer of which at least a portion extends in the vertical direction, a second gate electrode, and a second gate dielectric layer between the second channel layer and the second gate electrode, wherein the plurality of capacitor structures comprise a plurality of lower electrodes, an upper electrode, and a capacitor dielectric layer between the plurality of lower electrodes and the upper electrode, wherein each of the plurality of first connection contacts and the second channel layer of one of the plurality of second vertical transistor structures connect one of the plurality of conductive lines to the lower electrode of one of the plurality of capacitor structures, and wherein the first channel layer of one of the plurality of first vertical transistor structures and each of the plurality of second connection contacts connect one of the plurality of conductive lines to the lower electrode of another one of the plurality of capacitor structures.

3. The semiconductor memory device of claim 2, further comprising:

a plurality of third connection contacts connected to the plurality of second channel layers;

a plurality of first connection pads between the plurality of first connection contacts and the plurality of second channel layers; and a plurality of second connection pads connected to lower surfaces of the plurality of lower electrodes, the plurality of second connection contacts and the plurality of third connection contacts.

4. The semiconductor memory device of claim 1, wherein the plurality of first vertical transistor structures and the plurality of first connection contacts are alternately arranged in the first horizontal direction, and wherein the plurality of second connection contacts and the plurality of second vertical transistor structures are alternately arranged in the first horizontal direction.

5. The semiconductor memory device of claim 4, wherein a first channel layer in each of the plurality of first vertical transistor structures has an L-shaped vertical cross-section, and a second channel layer in each of the plurality of second vertical transistor structures has an inverted L-shaped vertical cross section.

6. The semiconductor memory device of claim 1, wherein a first channel layer in each of the plurality of first vertical transistor structures and a second channel layer in each of the plurality of second vertical transistor structures each have an I-shaped vertical cross section.

7. The semiconductor memory device of claim 1, wherein a first gate dielectric layer in each of the plurality of first vertical transistor structures and a second gate dielectric layer in each of the plurality of second vertical transistor structures each have an L-shaped vertical cross-section or an inverted L-shaped vertical cross-section.

8. The semiconductor memory device of claim 1, wherein one channel layer among a first channel layer included in one first vertical transistor structure among the plurality of first vertical transistor structures and a second channel layer included in one second vertical transistor structure among the plurality of second vertical transistor structures has an L-shaped vertical cross-section, and an other channel layer has an inverted L-shaped cross-section, and wherein the one second vertical transistor structure is connected to one first connection contact among the plurality of first connection contacts that is adjacent to the one first vertical transistor structure.

9. The semiconductor memory device of claim 1, wherein each of a first channel layer included in one first vertical transistor structure among the plurality of first vertical transistor structures and a second channel layer included in one second vertical transistor structure among the plurality of second vertical transistor structures has an L-shaped vertical cross-section or an inverted L-shaped cross-section, and wherein the one second vertical transistor structure is connected to one first connection contact among the plurality of first connection contacts that is adjacent to the one first vertical transistor structure.

10. The semiconductor memory device of claim 1, wherein a pair of first connection contacts among the plurality of first connection contacts is between a pair of first vertical transistor structures among the plurality of first vertical transistor structures, wherein the pair of first connection contacts is connected to a pair of second vertical transistor structures among the plurality of second vertical transistor structures, and wherein the pair of second vertical transistor structures among the plurality of second vertical transistor structures to which the pair of first connection contacts among the plurality of first connection contacts is connected is between a pair of second connection contacts among the plurality of second connection contacts, and wherein the pair of second connection contacts is connected to the pair of first vertical transistor structures among the plurality of first vertical transistor structures.

11. A semiconductor memory device comprising:

a substrate;

a conductive line extending in a horizontal direction on the substrate;

a first cell stack on the conductive line and comprising a first vertical transistor structure and a first connection contact;

a second cell stack on the first cell stack and comprising a second vertical transistor structure and a second connection contact; and a plurality of capacitor structures arranged on the second cell stack, wherein the first vertical transistor structure and the second connection contact are arranged in a vertical direction between the conductive line and one of the plurality of capacitor structures and are connected to each other in series, and wherein the first connection contact and the second vertical transistor structure are arranged in the vertical direction between the conductive line and another one of the plurality of capacitor structures and are connected to each other in series.

12. The semiconductor memory device of claim 11, wherein the first vertical transistor structure comprises a first channel layer having at least a portion extending in the vertical direction, a first gate electrode, and a first gate dielectric layer between the first channel layer and the first gate electrode, the second vertical transistor structure comprises a second channel layer having at least a portion extending in the vertical direction, a second gate electrode, and a second gate dielectric layer between the second channel layer and the second gate electrode, and the first channel layer and the second channel layer are disposed not to overlap each other in the vertical direction.

13. The semiconductor memory device of claim 12, wherein the first channel layer of the first vertical transistor structure and the second channel layer of the second vertical transistor structure have substantially mirror-symmetrical vertical cross-sections in the horizontal direction with respect to the vertical direction.

14. The semiconductor memory device of claim 12, wherein one of the first channel layer of the first vertical transistor structure and the second channel layer of the second vertical transistor structure has an L-shaped vertical cross-section, and the other one has an inverted L-shaped vertical cross-section.

15. The semiconductor memory device of claim 12, wherein the first channel layer of the first vertical transistor structure and the second channel layer of the second vertical transistor structure have vertical cross-sections having a same shape.

16. The semiconductor memory device of claim 15, wherein each of the first channel layer of the first vertical transistor structure and the second channel layer of the second vertical transistor structure has an L-shaped vertical cross-section or an inverted L-shaped vertical cross-section.

17. The semiconductor memory device of claim 15, wherein each of the first channel layer of the first vertical transistor structure and the second channel layer of the second vertical transistor structure has an I-shaped vertical cross-section.

18. A semiconductor memory device comprising:

a conductive line disposed on a substrate and extending in a horizontal direction;

a first cell stack on the conductive line and comprising a first vertical transistor structure, a first interlayer insulating layer surrounding the first vertical transistor structure, and a first connection contact adjacent to the first vertical transistor structure and passing through the first interlayer insulating layer, the first vertical transistor structure comprising a first channel layer having at least a portion extending in a vertical direction, a first gate electrode, and a first gate dielectric layer between the first channel layer and the first gate electrode;

a second cell stack on the first cell stack and comprising a second vertical transistor structure, a second interlayer insulating layer surrounding the second vertical transistor structure, and a second connection contact adjacent to the second vertical transistor structure and passing through the second interlayer insulating layer, the second vertical transistor structure comprising a second channel layer having at least a portion extending in the vertical direction, a second gate electrode, and a second gate dielectric layer between the second channel layer and the second gate electrode; and a plurality of capacitor structures on the second cell stack and comprising a plurality of lower electrodes electrically connected to the first channel layer and the second channel layer, an upper electrode, and a capacitor dielectric layer between the plurality of lower electrodes and the upper electrode, wherein the first vertical transistor structure and the second connection contact are arranged in the vertical direction between the conductive line and one of the plurality of lower electrodes and are connected to each other in series, wherein the first connection contact and the second vertical transistor structure are arranged in the vertical direction between the conductive line and another one of the plurality of lower electrodes and are connected to each other in series, and wherein the first channel layer and the second channel layer are disposed not to overlap each other in the vertical direction.

19. The semiconductor memory device of claim 18, wherein each of the first gate dielectric layer and the second gate dielectric layer has an L-shaped vertical cross-section or an inverted L-shaped vertical cross-section, and each of the first gate electrode and the second gate electrode has an I-shaped vertical cross-section.

20. The semiconductor memory device of claim 18, further comprising:

a third connection contact passing through an upper portion of the second interlayer insulating layer and connected to the second channel layer; and a plurality of connection pads connected to the second connection contact and the third connection contact and connected to lower surfaces of the plurality of lower electrodes.

* * * * *